(12) United States Patent
Prakash et al.

(10) Patent No.: US 11,264,110 B2
(45) Date of Patent: Mar. 1, 2022

(54) REFRESH OPERATIONS FOR MEMORY CELLS BASED ON SUSCEPTIBILITY TO READ ERRORS

(71) Applicant: SanDisk Technologies LLC, Addison, TX (US)

(72) Inventors: Abhijith Prakash, Milpitas, CA (US); Jiahui Yuan, Fremont, CA (US)

(73) Assignee: SanDisk Technologies LLC, Addison, TX (US)

(*) Notice: Subject to any disclaimer, the term of this patent is extended or adjusted under 35 U.S.C. 154(b) by 168 days.

(21) Appl. No.: 16/790,362

(22) Filed: Feb. 13, 2020

(65) Prior Publication Data
US 2021/0257039 A1    Aug. 19, 2021

(51) Int. Cl.
*G11C 16/34* (2006.01)
*G11C 16/04* (2006.01)
*G11C 5/14* (2006.01)
*G11C 11/56* (2006.01)

(52) U.S. Cl.
CPC ............ *G11C 16/3495* (2013.01); *G11C 5/14* (2013.01); *G11C 11/5628* (2013.01); *G11C 16/0483* (2013.01); *G11C 2211/5621* (2013.01)

(58) Field of Classification Search
CPC ... G11C 16/3495; G11C 16/0483; G11C 5/14; G11C 11/5628; G11C 2211/5621
See application file for complete search history.

(56) References Cited

U.S. PATENT DOCUMENTS

| | | | |
|---|---|---|---|
| 7,489,540 B2 | 2/2009 | Ramaraju et al. | |
| 9,459,406 B2 | 10/2016 | Matsumoto et al. | |
| 9,870,814 B2 | 1/2018 | Emmot | |
| 9,911,500 B2 | 3/2018 | Pang et al. | |
| 9,952,944 B1 | 4/2018 | Alrod et al. | |
| 10,109,354 B2 | 10/2018 | Nagase | |
| 10,235,294 B1 | 3/2019 | Lu et al. | |
| 10,347,315 B2 | 7/2019 | Reusswig et al. | |
| 2009/0046510 A1 | 2/2009 | Song et al. | |
| 2009/0310414 A1 | 12/2009 | Lee et al. | |

(Continued)

FOREIGN PATENT DOCUMENTS

EP    1403876 A1    3/2004

OTHER PUBLICATIONS

U.S. Appl. No. 16/415,457, filed May 17, 2019.

(Continued)

*Primary Examiner* — Mohammed A Bashar
(74) *Attorney, Agent, or Firm* — Vierra Magen Marcus LLP

(57) ABSTRACT

Apparatuses and techniques are described for periodically refreshing word line voltages in a block of memory cells based on the susceptibility of the block to read errors. One source of read errors is delayed read disturb which results from a low word line voltage during idle periods of the memory device. In one aspect, periodic refresh operations are optimized based on factors such as a number of bits per cell in the block and number of program-erase (P-E) cycles. For example, at high P-E cycles, the amplitude of a refresh voltage for a single-level cell (SLC) block can be 0 V or lower while the amplitude of a refresh voltage for a multi-level cell (MLC) block can be an intermediate voltage between 0 V and a pass voltage.

20 Claims, 17 Drawing Sheets

(56) References Cited

U.S. PATENT DOCUMENTS

| | | | |
|---|---|---|---|
| 2011/0138104 A1* | 6/2011 | Franceschini | G06F 12/0246 |
| | | | 711/103 |
| 2012/0250408 A1* | 10/2012 | Takeyama | G11C 11/5628 |
| | | | 365/185.03 |
| 2013/0051171 A1 | 2/2013 | Porter et al. | |
| 2014/0063938 A1 | 3/2014 | Oh et al. | |
| 2014/0334233 A1 | 11/2014 | Joo et al. | |
| 2016/0098216 A1* | 4/2016 | Huang | G06F 11/1072 |
| | | | 714/37 |
| 2019/0362781 A1 | 11/2019 | Shibata et al. | |

OTHER PUBLICATIONS

U.S. Appl. No. 16/704,817, filed Dec. 5, 2019.
International Search Report & The Written Opinion of the International Searching Authority dated Aug. 13, 2020, International Application No. PCT/US2020/035021.
International Search Report & The Written Opinion of the International Searching Authority dated Aug. 12, 2020, International Application No. PCT/US2020/035022.
U.S. Appl. No. 16/790,306, filed Feb. 13, 2020.
Response to Office Action dated Mar. 12, 2021, U.S. Appl. No. 16/790,306, filed Feb. 13, 2020.
Non-final Office Action dated Jan. 21, 2021, U.S. Appl. No. 16/790,306, filed Feb. 13, 2020.
Notice of Allowance dated May 6, 2021, U.S. Appl. No. 16/790,306, filed Feb. 13, 2020.

\* cited by examiner

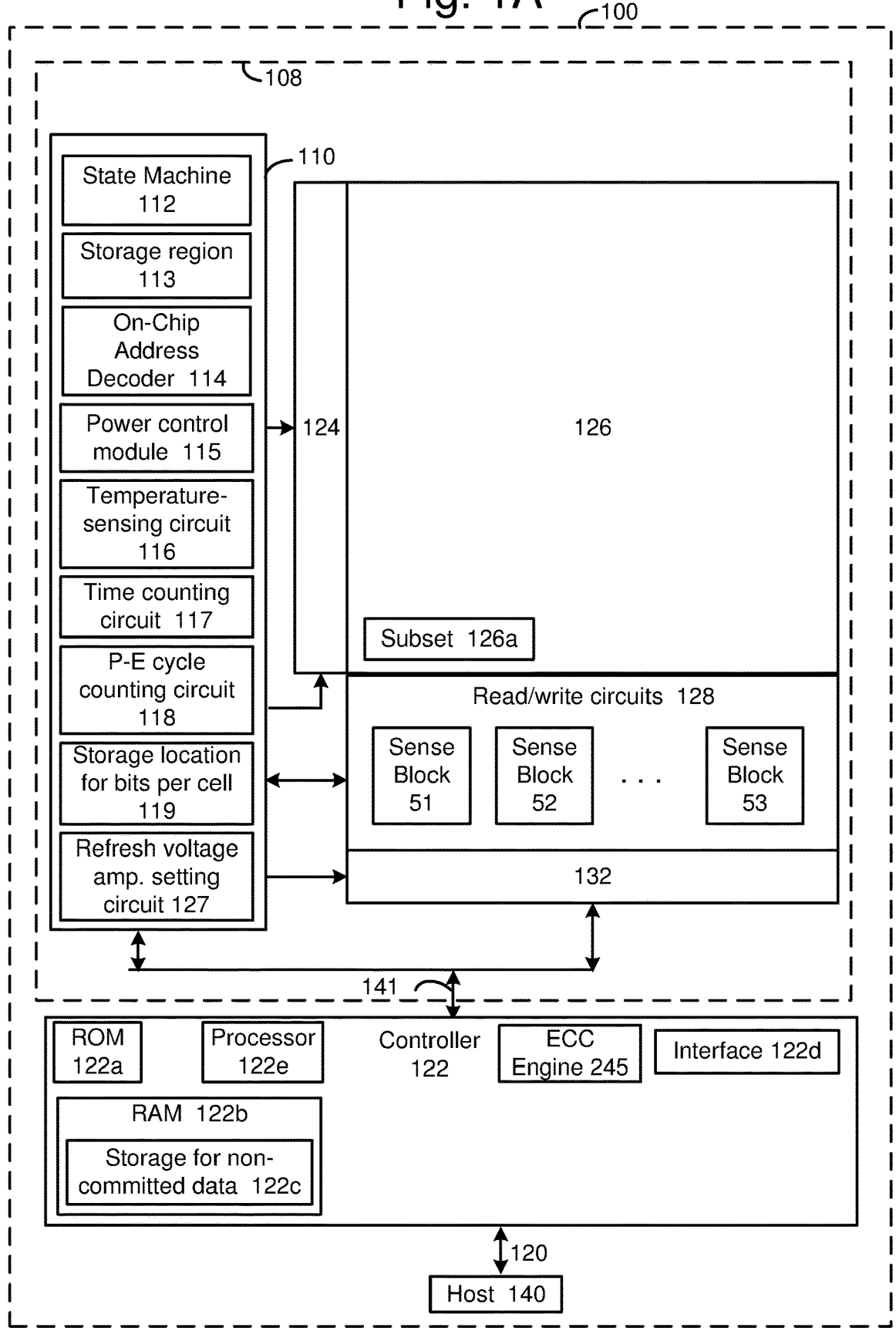

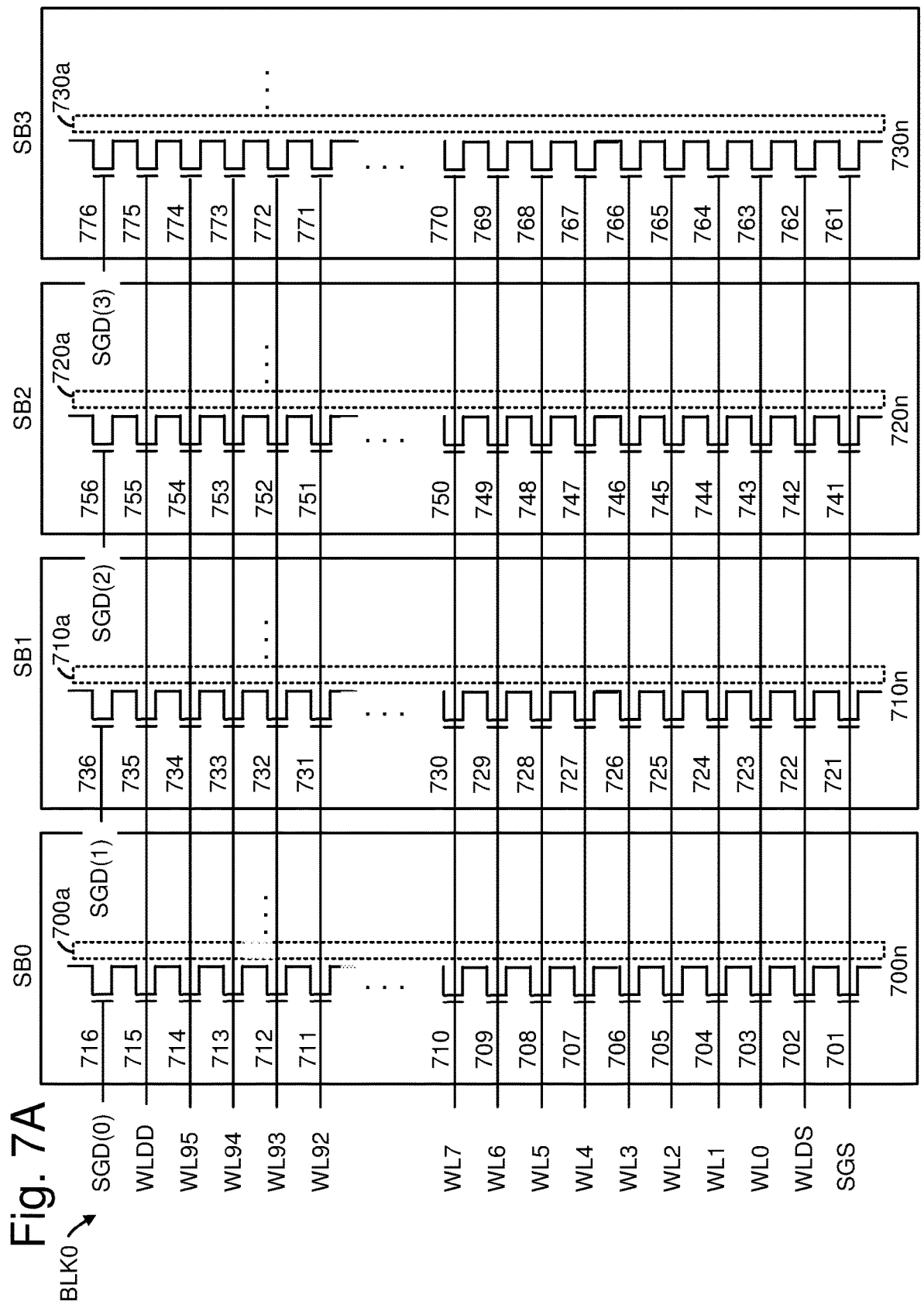

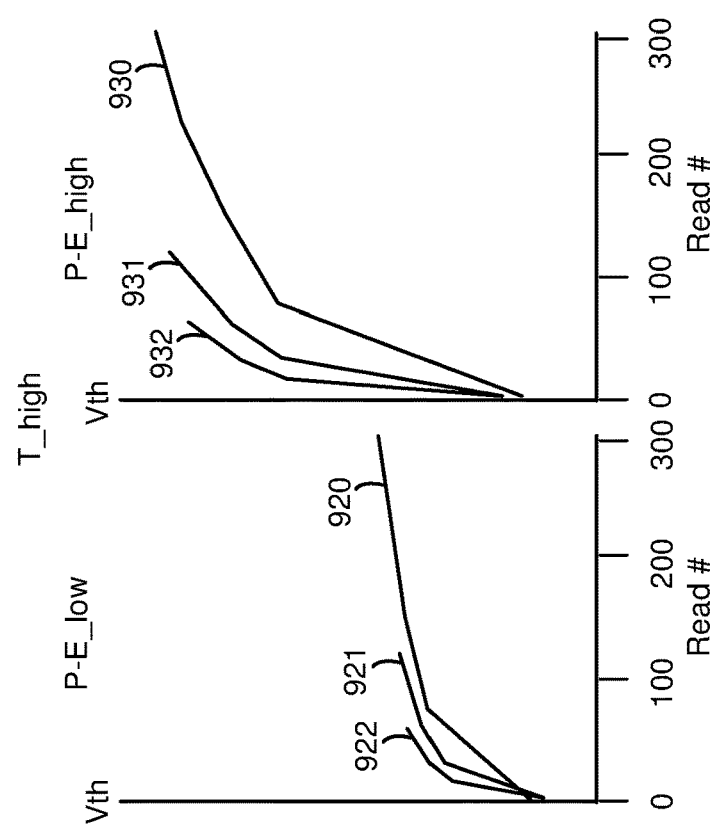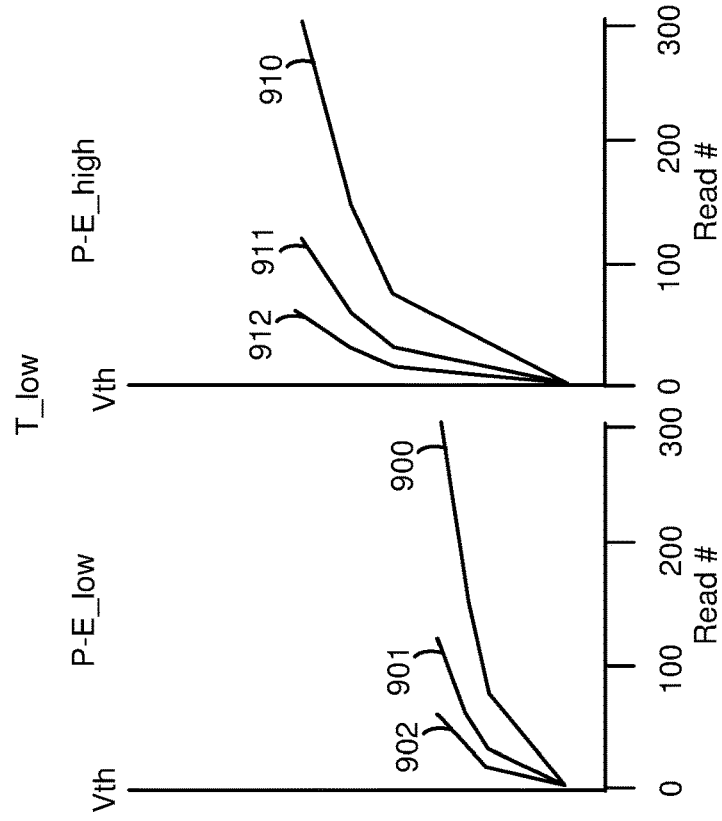

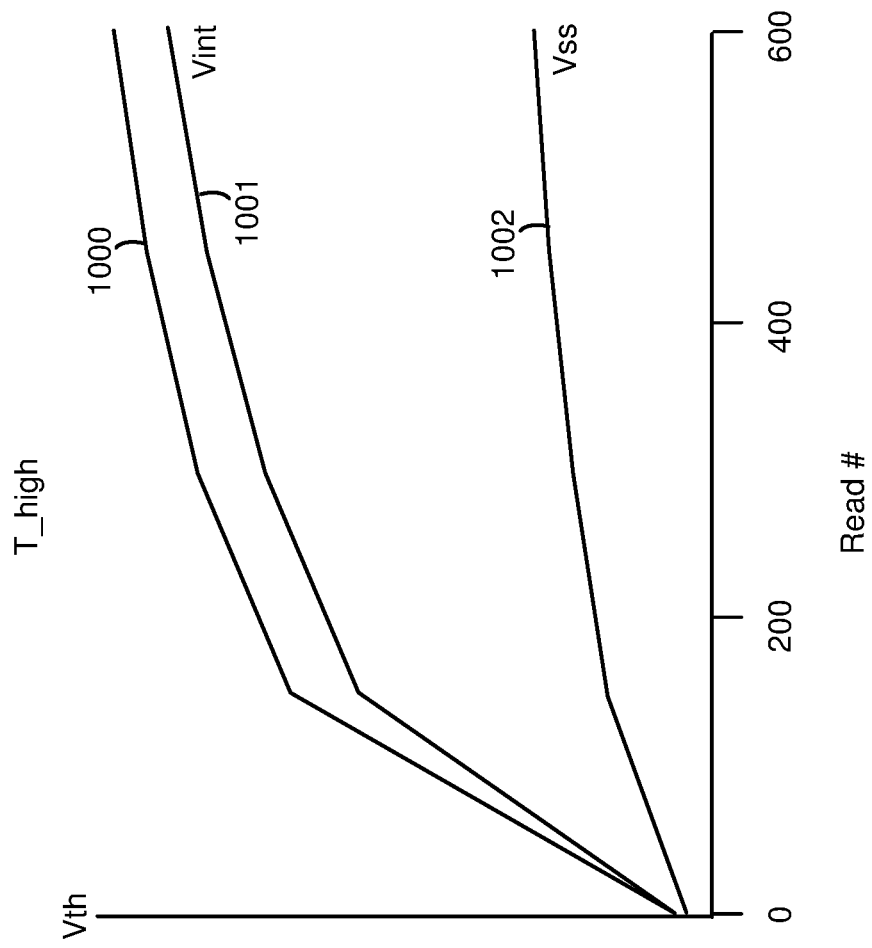

| Block id: | Bits per cell: |
|---|---|
| BLK0 | SLC |
| BLK1 | MLC |
| BLK2 | MLC |
| BLK3 | MLC |

| Bits per cell: | P-E cycles: | Amplitude: |
|---|---|---|
| SLC | <P-E_th1 | Vint1 |
| SLC | >=P-E_th1 | 0 V |
| MLC | <P-E_th2 | Vhigh (Vread) |
| MLC | >=P-E_th2(<P-E_th1) | Vint2 (>Vint1) |

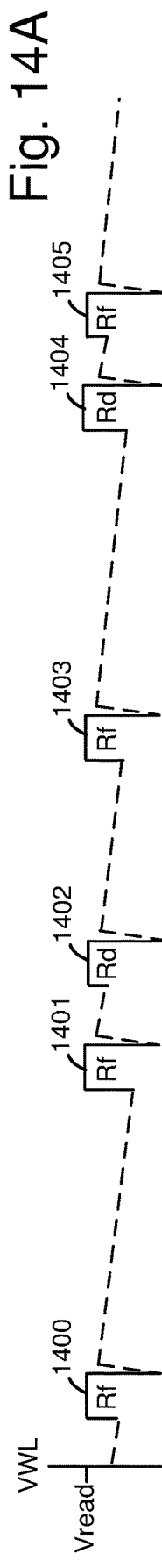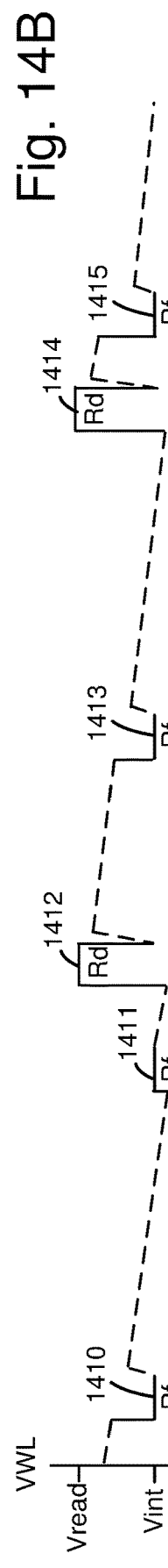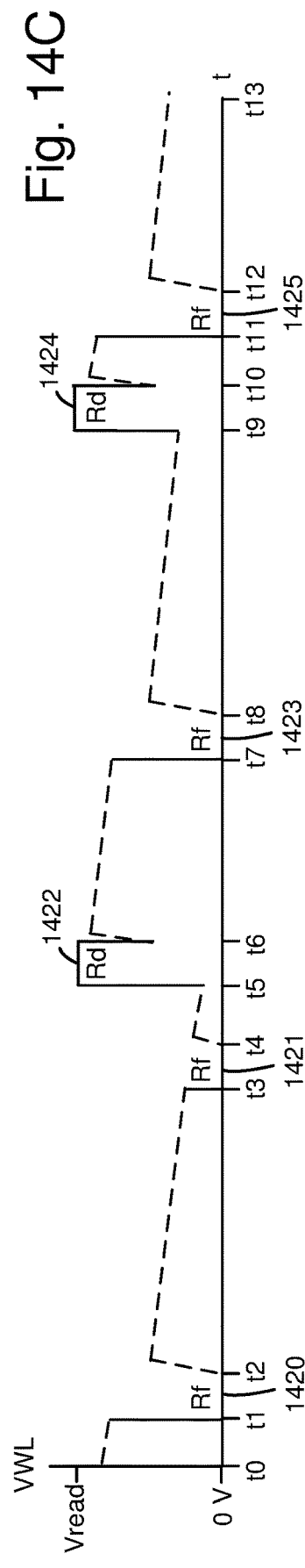

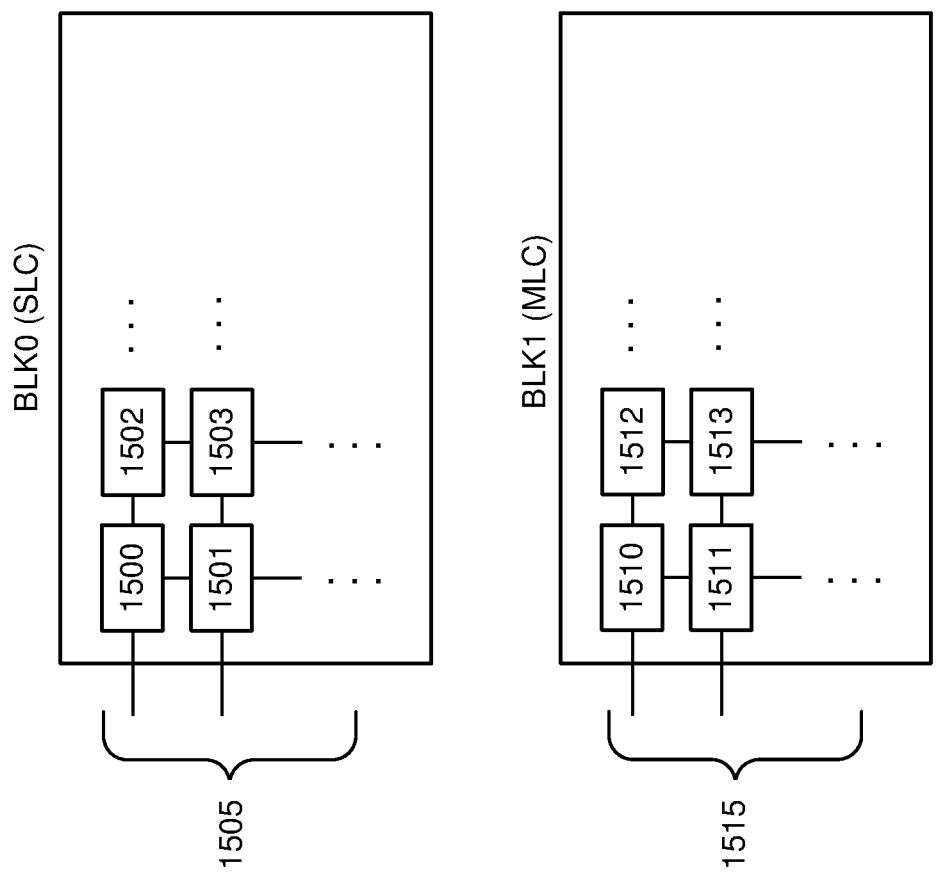

REFRESH OPERATIONS FOR MEMORY CELLS BASED ON SUSCEPTIBILITY TO READ ERRORS

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in blocks, for instance. However, various challenges are presented in operating such memory devices.

BRIEF DESCRIPTION OF THE DRAWINGS

FIG. 1A is a block diagram of an example storage device.

FIG. 7A depicts an example view of NAND strings in a block BLK0 which is consistent with FIGS. 4 and 6.

FIG. 9A depicts plots of an average upper tail Vth of erased state memory cells as a function of a number of read operations and a delay between the read operations, showing the effects of delayed read disturb (DRD), for a low ambient temperature and a low number of P-E cycles.

FIG. 9B depicts plots of an average upper tail Vth of erased state memory cells as a function of a number of read operations and a delay between the read operations, showing the effects of DRD, for a low ambient temperature and a high number of P-E cycles.

FIG. 9C depicts plots of an average upper tail Vth of erased state memory cells as a function of a number of read operations and a delay between the read operations, showing the effects of DRD, for a high ambient temperature and a low number of P-E cycles.

FIG. 9D depicts plots of an average upper tail Vth of erased state memory cells as a function of a number of read operations and a delay between the read operations, showing the effects of DRD, for a high ambient temperature and a high number of P-E cycles.

FIG. 10 depicts plots of a maximum upper tail Vth of erased state memory cells as a function of a number of read operations, for the cases of refresh operations with a high amplitude of Vread (plot 1000), refresh operations with an intermediate amplitude of Vint (plot 1001) and refresh operations with a low amplitude of Vss=0 V (plot 1002).

FIG. 14A depicts an example of word line voltages during read operations and refresh operations with a high amplitude pulse, Vread.

FIG. 14B depicts an example of word line voltages during read operations and refresh operations with an intermediate amplitude pulse, Vint.

FIG. 14C depicts an example of word line voltages during read operations and refresh operations with a low amplitude pulse, Vss.

FIG. 15 depicts an example of an SLC block and an MLC block in a refresh operation.

DETAILED DESCRIPTION

Apparatuses and techniques are described for periodically refreshing word line voltages in a memory device.

Figure 4:
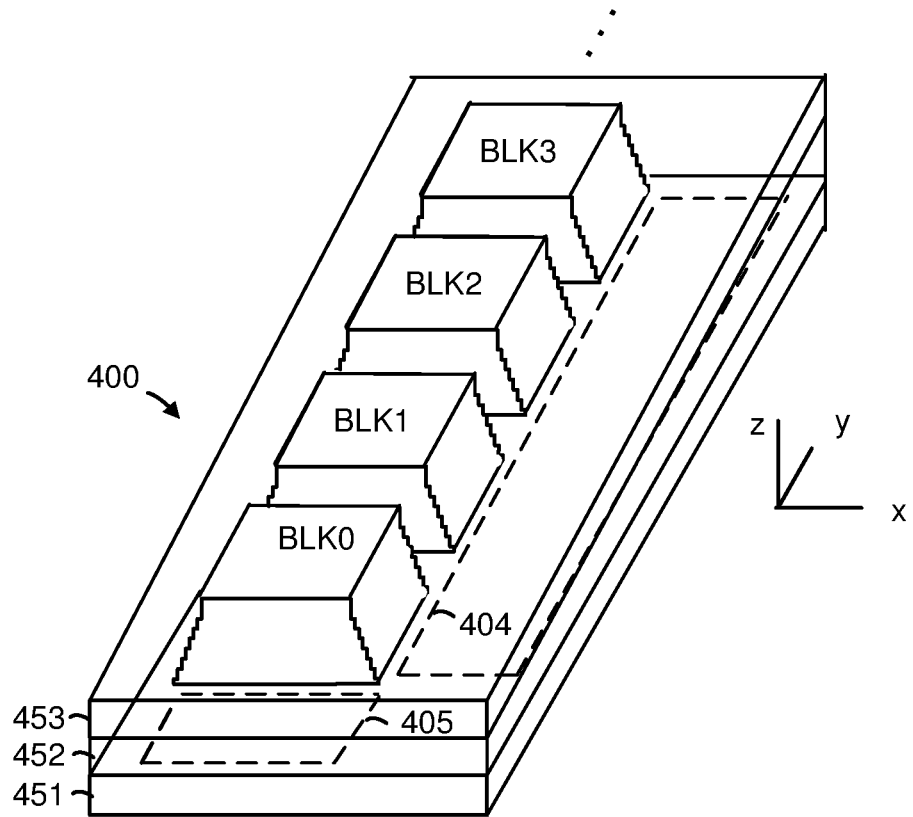
FIG. 4 is a perspective view of a memory device 400 comprising the blocks BLK0-BLK3 of FIG. 3 in an example 3D configuration.

In a memory device, memory cells can be arranged in a sequence of blocks such as depicted in FIG. 4. The memory cells can be joined to one another, e.g., in NAND strings, such as depicted in FIG. 7A. Further, the memory cells can be arranged in a 2D or 3D structure. In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate. The memory cells in a block can be subject to program, read and erase operations.

Each memory cell may be associated with a data state according to write data in a program command Based on its data state, a memory cell will either remain in the erased state or be programmed to a programmed data state. For example, in a one bit per cell block, there are two data states including the erased state and the programmed state. See FIG. 8A. In a two-bit per cell block, there are four data states including the erased state and three higher data states referred to as the A, B and C data states. See FIG. 8B. In a three-bit per cell block, there are eight data states including the erased state and seven higher data states referred to as the A, B, C, D, E, F and G data states. See FIG. 8C. In a four-bit per cell block, there are sixteen data states including the erased state and fifteen higher data states. A block with a single bit per cell is referred to as a single-level cell (SLC) block while a block with multiple bits per cell is referred to as a multi-level cell (MLC) block.

After the memory cells are programmed, the data can be read back in a read operation. A read operation can involve applying a series of read voltages to a selected word line while sensing circuitry determines whether cells connected to the selected word line are in a conductive (turned on) or non-conductive (turned off) state. If a cell is in a non-conductive state, the Vth of the memory cell exceeds the read voltage. The read voltages are set at levels which are expected to be between the threshold voltages of adjacent data states. During the read operation, a pass voltage such as 8-9 V is applied to the unselected word lines to provide the associated memory cells in a strongly conductive state.

However, the Vth of the memory cells can vary based on changes in the word line voltage when the memory cells are idle, between program or read operations. In particular, word line voltages can be coupled up from the channels of the NAND strings. In one possible coupling up mechanism, a pass voltage is applied to a word line during a sensing operation, such as a read operation or a verify test of a program operation, and subsequently ramped down to 0 V, for instance. The ramp down causes a down coupling in the channel voltage. See, e.g., plot 1231 in FIG. 12A and plot 1271 in FIG. 12B. The down coupling subsequently dissipates and the channel voltage increases to a nominal level, close to 0 V, while the word line voltage is floated. See, e.g., plot 1232 in FIG. 12A and plot 1272 in FIG. 12B. This results in a coupling up of the word line voltage to a positive voltage such as about 4-5 V. See, e.g., plot 1204 in FIG. 12A and plot 1244 in FIG. 12B. The positive word line voltage is desirable as it tends to keep the Vth of the memory cells at a stable level. Although, over time, such as several minutes, the word line voltage discharges, resulting in a shift in the Vth of the memory cells. See FIG. 8A-8C.

When the word line voltages of a block are discharged, the block is in a first read or cold read state. This can occur when a memory device is powered on, or when the coupled up word line voltage has discharged after a sensing operation. When the word line voltages of a block are coupled up, the block is in a second read or warm read state. This can occur just after a sensing operation has been performed.

A refresh operation can be performed periodically to maintain the positive word line voltage during the idle time. The refresh operation can involve applying a refresh voltage to the word lines at the pass voltage level, and subsequently floating the word line voltages.

However, a type of disturb referred to as delayed read disturb (DRD) can increase the upper tail Vth of the erased state memory cells, as depicted in FIGS. 8A-8C, 9A-9D and 10, potentially resulting in uncorrectable read errors. This disturb is caused by the coupled up word line voltages providing a weak programming of the erased state memory cells. DRD is a function of various factors such as the number of read operations, the time period between successive read operations, the number of program-erase (P-E) cycles and the operating temperature of the memory device. DRD is especially worse for heavily cycled blocks and is accelerated at higher temperatures. DRD is also worse for SLC blocks than for MLC blocks.

Techniques provided herein address the above and other issues. In one aspect, periodic refresh operations are performed for a block, where the refresh operation is optimized based on factors such as a number of bits per cell in the block, temperature and number of P-E cycles. For example, the amplitude of a refresh voltage in the refresh operation for an SLC block can be lower than for an MLC block. The amplitude can also be lower when the number of P-E cycles is higher. The amplitude can range from a high voltage such as a read pass voltage to an intermediate voltage and to 0 V or even a negative voltage.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 141.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a time counting circuit 117, a P-E cycle counting circuit 118, a storage location for bits per cell 119 and a refresh voltage amplitude (amp.) setting circuit 127. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach. The temperature-sensing circuit 116 can detect a temperature of the memory device on during the lifetime of the memory device, e.g., every minute.

The time counting circuit 117 can count time and determine when an elapsed time has passed for initiating a refresh operation for a block as discussed herein. For example, see step 1107 in FIG. 11A.

The P-E cycle counting circuit 118 can track the number of program-erase (P-E) cycles of a block and classify the block into a category based on the number of P-E cycles. For example, the blocks can be classified into first, second and third categories which represent the beginning, middle and end of life, respectively, of a block. The classifications for the SLC blocks can be different than those for the MLC blocks since the SLC blocks typically can undergo more P-E cycles than MLC blocks in their lifetime. Also, the blocks can be periodically reclassified, and the number of blocks per group can change over time. In another example, the blocks are classified based on whether the number of P-E cycles is above or below a threshold. See, e.g., the threshold P-E_th1 and P-E_th2 in FIG. 11C.

The storage location for bits per cell 119 can include a table which indicates a number of bits per cell for each block of memory cells. See, e.g., FIG. 11B. In one approach, the blocks are classified as SLC or MLC blocks.

The refresh voltage amplitude setting circuit 127 can use information for the circuits 116-119 and 127 to set an optimum refresh voltage amplitude for each block of a set of blocks involved in a refresh operation. For example, the circuit 127 can evaluate the number of P-E cycles for a block by comparing the number of P-E cycles to a threshold such as P-E_th1 for SLC blocks and P-E_th2 for MLC blocks. See FIG. 11C. The circuit 127 can also consider the number of bits per cell from the storage location for bits per cell 119, and the temperature from the temperature-sensing circuit 116.

Figure 1B:
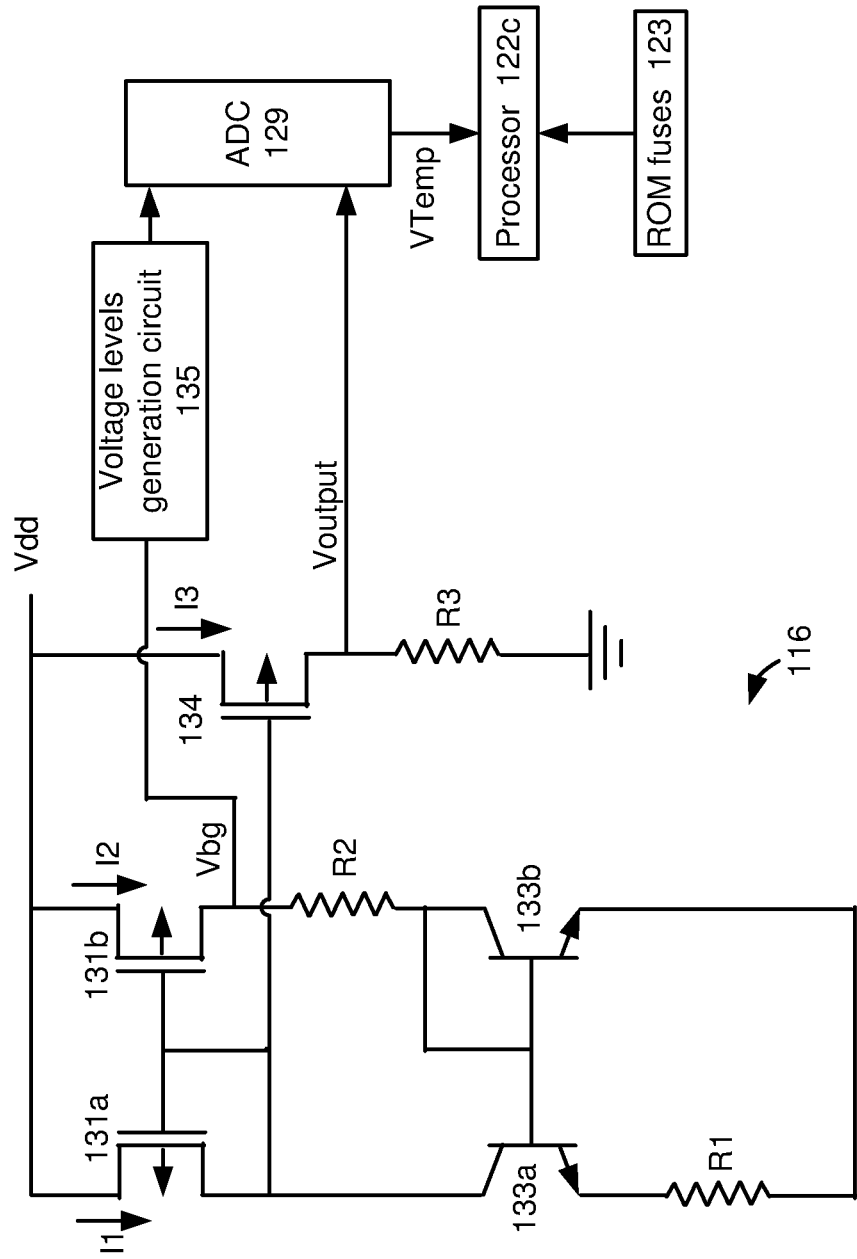
FIG. 1B depicts an example of the temperature-sensing circuit 116 of FIG. 1A.

See FIG. 1B for an example implementation of the temperature-sensing circuit. The circuits 116-119 and 127 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, time counting circuit 117, P-E cycle counting circuit 118, sense blocks 51, 52, ..., 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
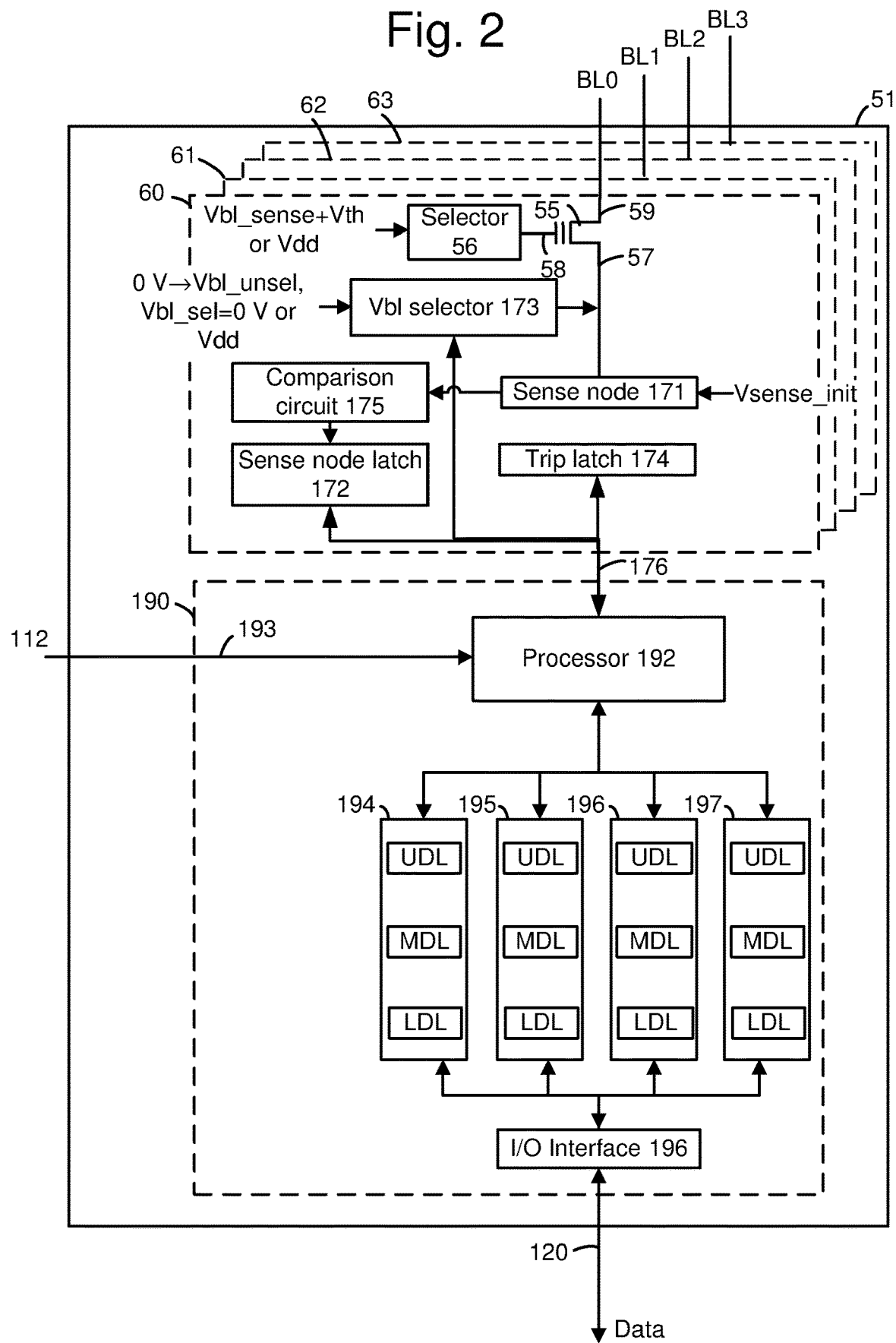
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one or a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
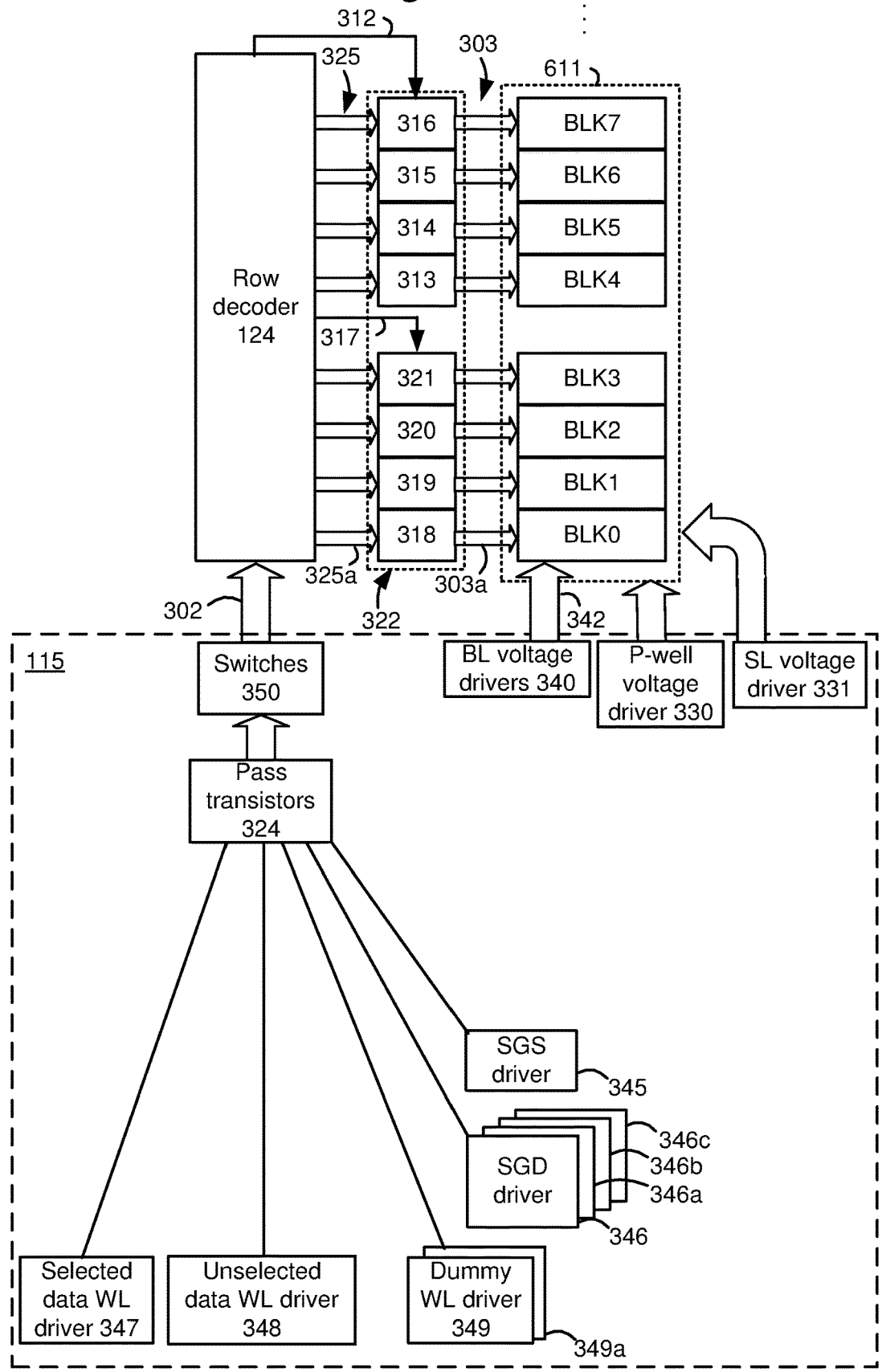
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, BLK0 to BLK3, and another set of four related blocks, BLK4 to BLK7. The blocks can be in one or more planes. The row decoder 124 of FIG. 1A provides voltages to word lines and select gate control lines of each block via pass transistors 322. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, e.g., switches, which in turn are connected to control gate lines of BLK4-BLK7, respectively. A control gate line 317 is connected to sets of pass transistors 318-321, which in turn are connected to control gate lines of BLK0-BLK3, respectively.

Typically, program or read operations are performed on one selected sub-block at a time in a block. An erase operation may be performed on a selected block or sub-block.

The row decoder can connect global control lines 302 to pre-switch local control lines 325 for each block. The pre-switch local control lines 325 are connected to the pass transistors 322, which in turn are connected to the post-switch local control lines 303 such as word lines. For example, for BLK0, the pre-switch local control lines 325a are connected to the post-switch local control lines 303a via the pass transistors 318. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

In some cases, there can be a delay in changing the word line voltage based on a change in a voltage on the global control lines 302 and the pre-switch local control lines 325 due to the capacitance of the word lines. If the pass transistors 322 are cutoff too soon, as may be required to meet timing requirements in some cases, the word line voltages may not reach the voltage on the global control lines 302 and the pre-switch local control lines 325. For example, see plots 1243 and 1243a in FIG. 12B.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6. For example, the driver 348 can be used to apply a pre-charge voltage and a pass voltage on the unselected word lines during a program loop of a program operation.

The voltage drivers can also include separate SGD drivers for each sub-block. For example, SGD drivers 346, 346a, 346b and 346c can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 612b in the p-well region 611b, e.g., via the conductive path 682. See FIG. 6. In one approach, the p-well region 611b is common to the blocks. A set of bit lines 342 is also shared by the blocks. The source line (SL) voltage driver 331 provides a voltage Vsl to the n+ contact 612c in the p-well region 611b, e.g., via the local interconnect 651.

Bit line voltage drivers 340 include voltage sources which provide voltages to the bit lines 342, such as a program-inhibit voltage signal, a program-enable voltage signal, a pre-charge voltage signal, and a voltage for sensing. The program-inhibit voltage signal has a magnitude of 1-2 V, for example, to inhibit programming in a NAND string. The program-enable voltage signal has a magnitude of 0 V, for example, to allow programming to occur for a selected memory cell in a NAND string. The pre-charge voltage signal has a magnitude of 1-2 V, for example, to pre-charge a channel of a NAND string. The voltage for sensing can have a magnitude of 0.5 V, for example, to facilitate sensing for a selected memory cell in a NAND string during a read operation or a verify test.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4 is a perspective view of a memory device 400 comprising the blocks BLK0-BLK3 of FIG. 3 in an example 3D configuration. On the substrate are the example blocks BLK0-BLK3 of memory cells (storage elements) and peripheral areas with circuitry for use by the blocks. The peripheral area 404 runs along an edge of each block while the peripheral area 405 is at an end of the set of blocks. The circuitry can include voltage drivers which can be connected to control gate layers, bit lines and source lines of the blocks. In one approach, control gate layers at a common height in the blocks are commonly driven. The substrate 451 can also carry circuitry under the blocks, and one or more lower metal layers which are patterned in conductive paths to carry signals of the circuitry. The blocks are formed in an intermediate region 452 of the memory device. In an upper region 453 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
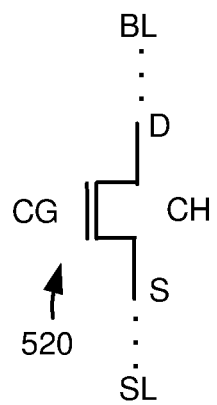
FIG. 5 depicts an example transistor 520.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string.

Figure 6:
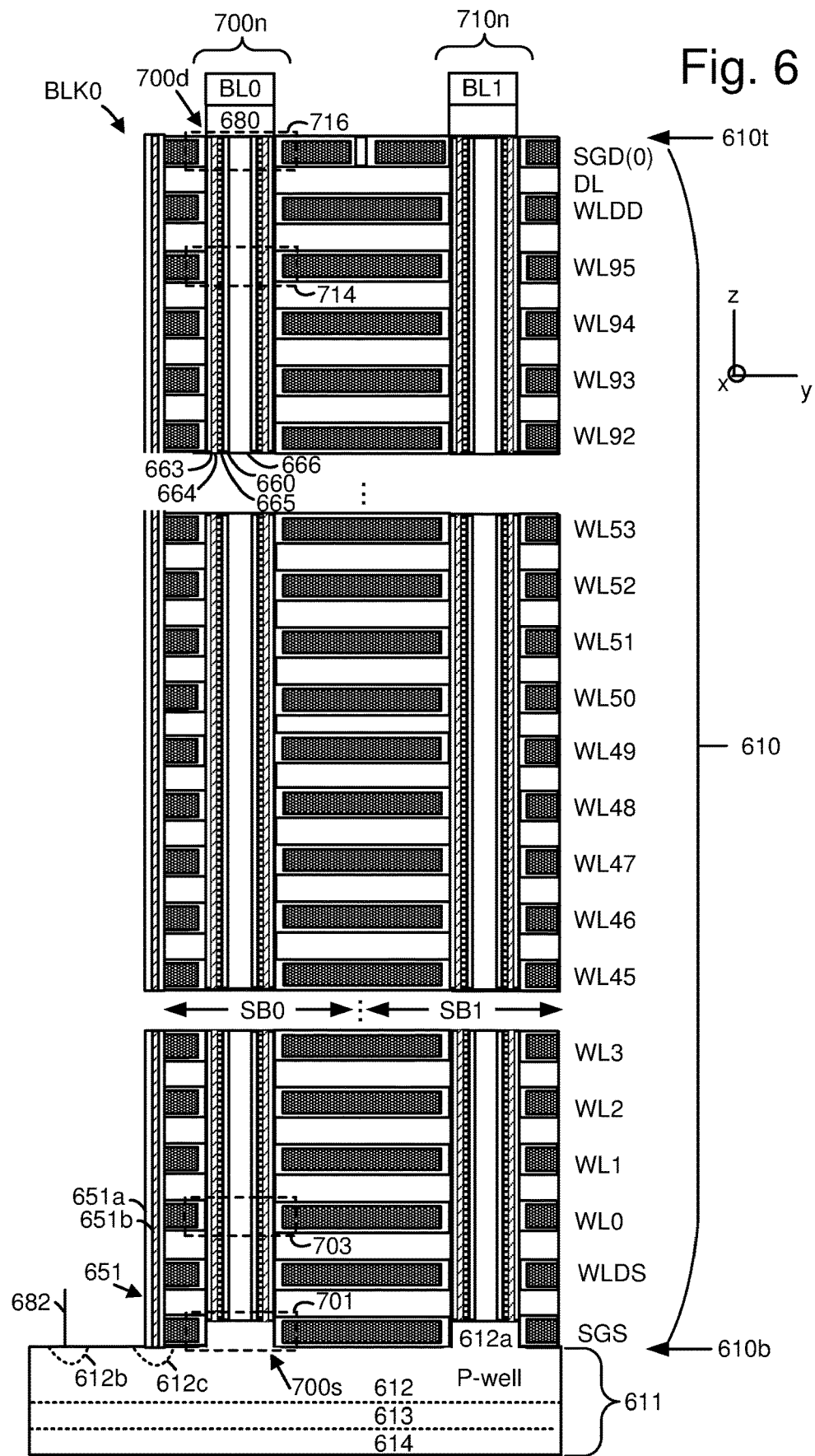
FIG. 6 depicts an example cross-sectional view of a portion of the block BLK0 of FIG. 4, including NAND strings 700n and 710n.

FIG. 6 depicts an example cross-sectional view of a portion of the block BLK0 of FIG. 4, including NAND strings 700n and 710n. In this example, the NAND strings 700n and 710n are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3) connected to the source ends of the NAND strings. The p-well region may comprise epitaxial regions 612 which extend upward adjacent to the source-side select gate transistors. The p-well region can include an n+contact 612c connected to a local interconnect 651 for receiving a source line voltage, and a p+contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel FIG. 7A depicts an example view of NAND strings in the block BLK0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

Another option is to program each sub-block before proceeding to the next sub-block. For example, SB0 may be programmed in WL0-WL95, then SB1 may be programmed in WL0-WL95, and so forth.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 7B:
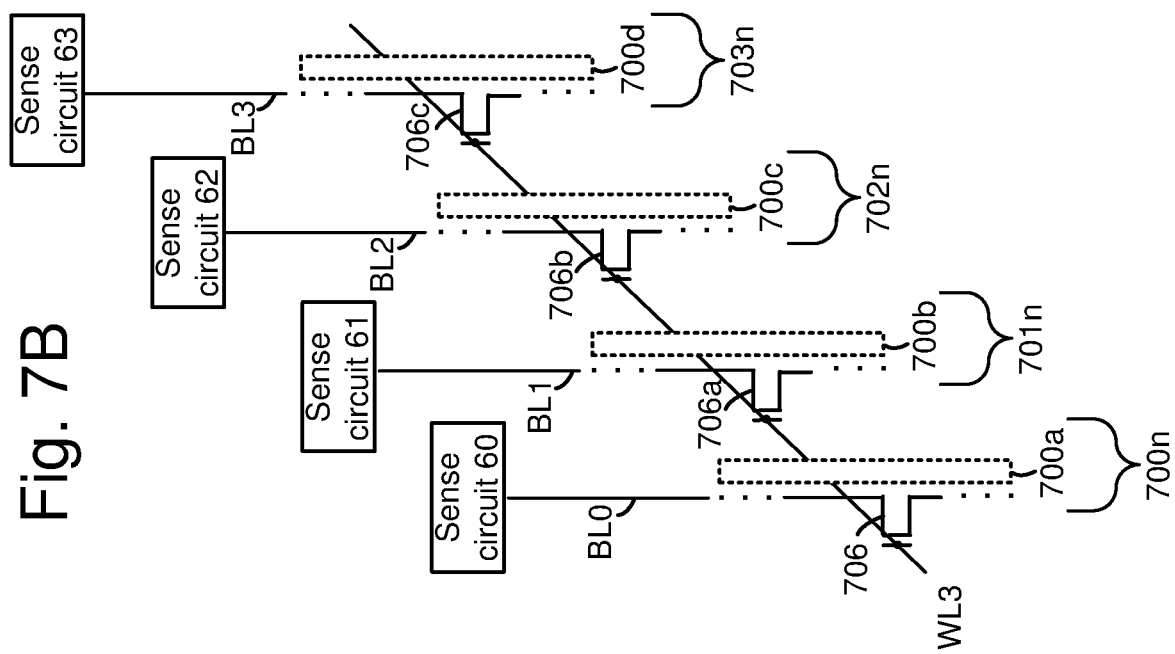
FIG. 7B depicts an example view of memory cells connected to WL3 in the sub-block SB0 of FIG. 7A, with respective NAND strings, bit lines and sense circuits.

FIG. 7B depicts an example view of memory cells connected to WL3 in the sub-block SB0 of FIG. 7A, with respective NAND strings, bit lines and sense circuits. The memory cell 706 and channel 700a of the NAND string 700n in SB0 of FIG. 7A are depicted, along with a respective bit line BL0. SB0 also includes memory cells 706a, 706b and 706c in NAND strings 701n, 702n and 703n, respectively, which have channels 700b, 700c and 700d, respectively, and which are connected to bit lines BL1, BL2 and BL3, respectively. The bit lines BL0-BL3 are connected to the sense circuits 60-63, respectively, of FIG. 2.

In a program loop, the memory cells 706 and 706a could be examples of selected and unselected memory cells, respectively, in which case the NAND strings 700n and 701n are examples of selected and unselected NAND strings, respectively, and the bit lines BL0 and BL1 are examples of selected and unselected bit lines, respectively.

Figure 8A:
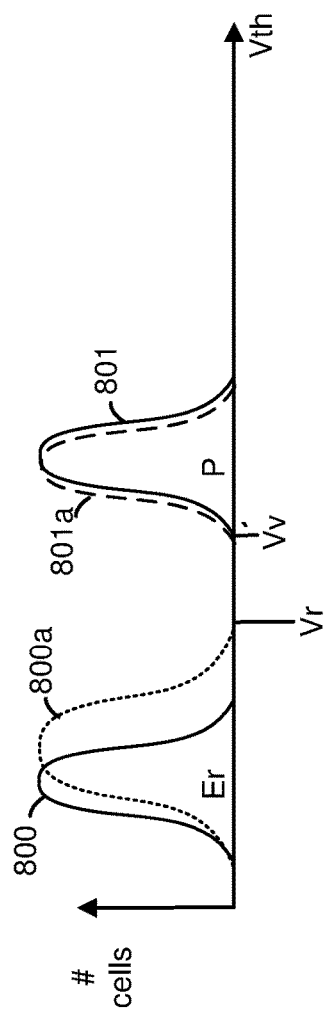
FIG. 8A depicts example Vth distributions of SLC memory cells storing one bit per cell.
Figure 8B:
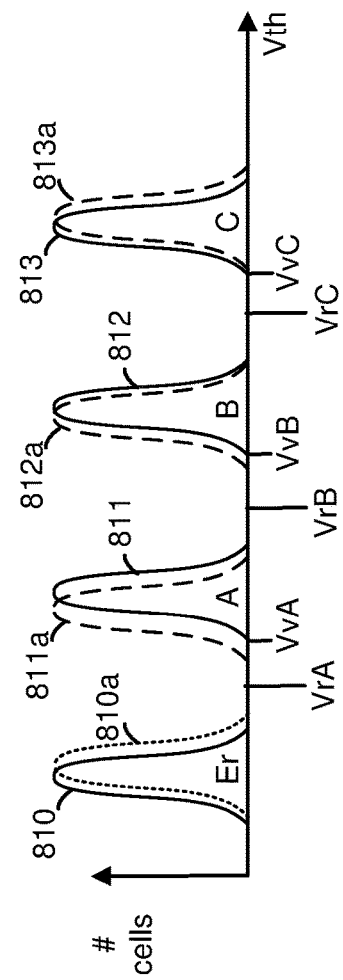
FIG. 8B depicts example Vth distributions of MLC memory cells storing two bits per cell.
Figure 8C:
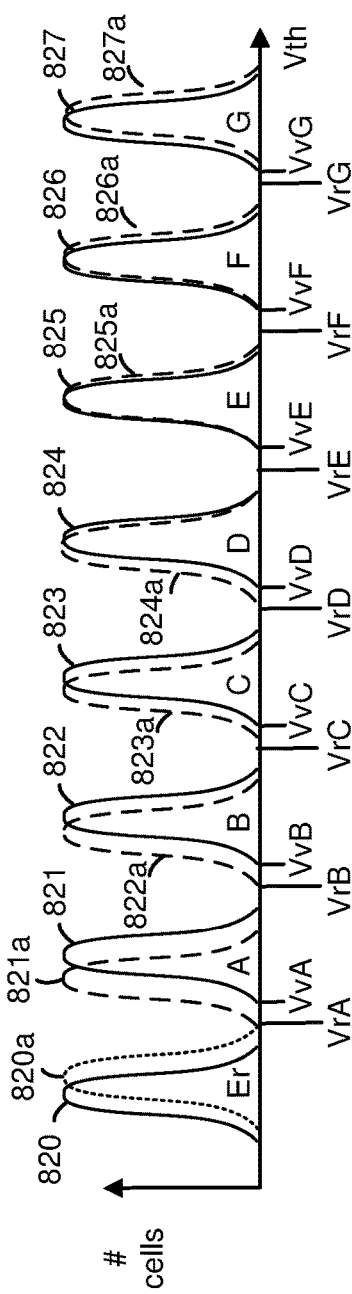
FIG. 8C depicts example Vth distributions of MLC memory cells storing three bits per cell.

FIG. 8A depicts example Vth distributions of SLC memory cells storing one bit per cell. In FIG. 8A to 8C, the vertical axis represents a number of memory cells on a logarithmic scale and the horizontal axis represents Vth in Volts.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

The Vth distributions 800 and 800a represent an erased state (Er) without and with DRD, respectively. The higher Vth distribution 800a is caused by DRD, which increases the Vth of the upper tail of the erased state memory cells. The Vth distributions 801 and 801a represent a programmed data state (P) in the second and first read states, respectively. The higher Vth distribution 801 is caused by a coupled up word line voltage, while the lower Vth distribution 801a is caused by a discharge in the word line voltage.

A verify voltage for the programmed state is Vv and a read voltage for distinguishing between the two states is Vr.

DRD is caused primarily by residual voltages on the word lines. These voltages cause temperature-dependent charge hopping through the traps generated in the dielectric tunneling layer 665 during program-erase cycling. This charge movement under the influence of the residual word line voltages results in a continuous erased state upshift as long as the residual word line voltage persists.

For heavily cycled SLC blocks in particular, DRD is a reliability problem and can prevent a memory device from meeting read disturb and data retention specifications. Moreover, DRD is expected to worsen in future memory devices if appropriate countermeasures such as provided herein are not implemented. DRD also affects the specifications regarding operating temperatures and the qualification of the memory device based on P-E cycles. Furthermore, with the increase in MLC endurance requirements, DRD is expected to be a concern for MLC blocks as well.

Discharging the residual word line voltages helps reduce DRD, but pushes the memory cells into the undesired first read state. This increases read errors since the read voltages are tuned to the second read state. A solution is to optimize refresh operations which provide the memory cells remain in the second read state. The refresh operations can be performed by applying a voltage signal to the word lines which has an amplitude which is sufficiently high to maintain the programmed memory cells in the second read state while minimizing DRD for the erased state memory cells.

An optimal solution observes that blocks which are more susceptible to DRD errors are different from blocks which are more susceptible to first read state errors. For example, SLC blocks, especially at the end of life, are more susceptible than MLC blocks to DRD. Further, MLC blocks are more susceptible than SLC blocks to first read state errors due to much smaller margins between the Vth distributions of adjacent data states.

An optimum solution can adjust the amplitude of the refresh voltage signal for a block based on the susceptibility of the block to DRD and first read state errors. The amplitude can range from a high level such as Vread, which is typically the highest voltage applied to the unselected word lines during read operations, to Vss or even a negative voltage if available on the memory device.

Three example scenarios are discussed. In a first scenario, the amplitude is a high level such as Vread. This can be optimal for blocks which are less susceptible to DRD errors but need to be kept in the second read state to avoid first read state errors. Such blocks can include MLC blocks with relatively low P-E cycles, e.g., less than P-E_th2 in FIG. 11C. See FIG. 14A for an example scenario of read operations and refresh operations using a high amplitude refresh voltage signal.

Figures 11A, 11B, 11C:
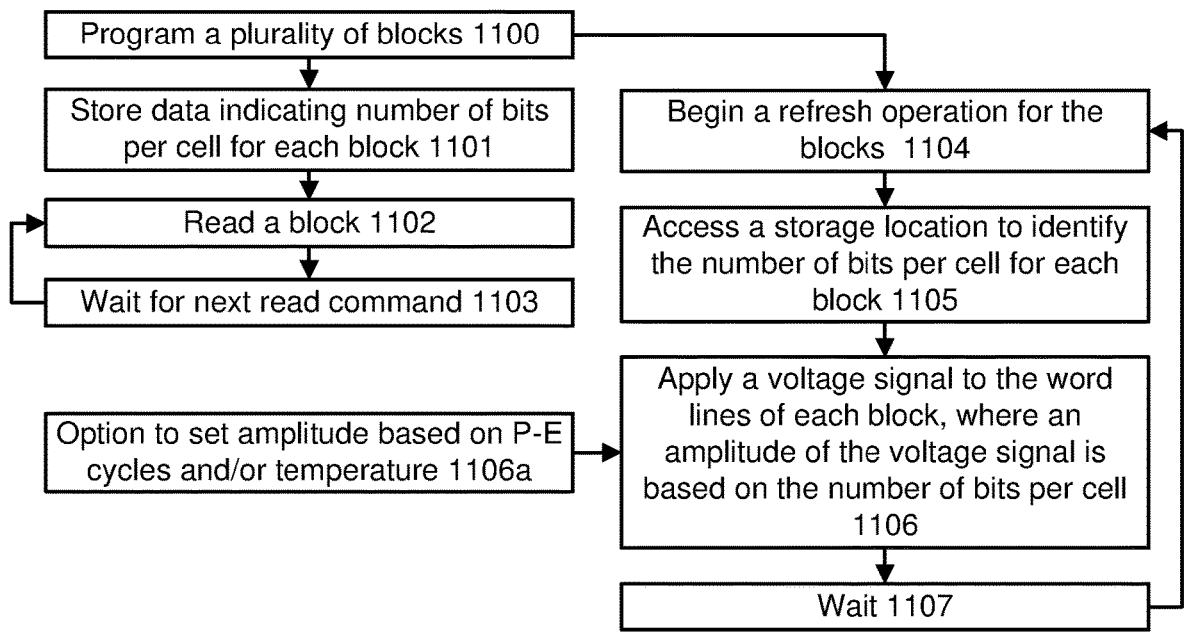
FIG. 11A depicts a flowchart of an example process for refreshing word line voltages.
FIG. 11B depicts an example table of the storage location for bits per cell 119 of FIG. 1A.
FIG. 11C depicts an example table of the refresh voltage amplitude setting circuit 127 of FIG. 1A.

In a second scenario, the amplitude is an intermediate level such as Vint1 or Vint2 (FIG. 11C). This can be optimal for blocks which are susceptible to DRD errors but need to be strictly kept in the second read state. Such blocks can include MLC blocks, e.g., with three bits per cell, with relatively high P-E cycles, e.g., greater than P-E_th2 in FIG. 11C. See FIG. 14B for an example scenario of read operations and refresh operations using an intermediate amplitude refresh voltage signal.

In this case, a tradeoff is made between the requirements to reduce both DRD errors and first state errors. The intermediate level, which is between the highest and lowest amplitudes, can be determined based on factors such as the workload, e.g., the expected frequency of read operations. If the expected frequency is relatively high, the intermediate level can be relatively low, since the read operations will provide a frequent coupling up of the word line voltages. The intermediate level should maintain the word line voltages in a range which is sufficiently high to avoid the first read state errors and sufficiently low to avoid the DRD errors.

In a third scenario, the amplitude is a low level such as Vss or a negative voltage (FIG. 11C). This can be optimal for blocks which are highly susceptible to DRD errors and need not be kept in the second read state. Such blocks can include SLC blocks with relatively high P-E cycles, e.g., greater than P-E_th1 in FIG. 11C. See FIG. 14C for an example scenario of read operations and refresh operations using an intermediate amplitude refresh voltage signal.

In general, characteristics of the of the refresh voltage signal such as the amplitude, frequency and duration or pulse width can be optimized considering factors such as the operating temperature, user/system workload, number of P-E cycles and number of bits per cell. Moreover, these characteristics can be dynamically adjusted based on factors such as changes in temperature, which can affect the discharge rate of the word line voltage and the magnitude of the DRD. The characteristics can also be adjusted based on a change in the precision of a program operation which affects the margins between the data states, and hence the susceptibility to DRD or first read state errors. A higher precision corresponds with larger margins between adjacent states. One example of increasing the program precision, and decreasing the Vth widths for each state, is performing a multi-pass program operation instead of a single pass program operation, and/or programming using a smaller step size.

For example, the refresh voltage amplitude can be relatively low for MLC blocks with a relatively high precision and a relatively high margin between adjacent states. In this case, a larger Vth downshift can reduce DRD for the erased state without causing first read state errors for the programmed states.

FIG. 8B depicts example Vth distributions of MLC memory cells storing two bits per cell. The Er state without and with DRD is represented by the Vth distributions 810 and 810a, respectively. The A-C data states are represented by the Vth distributions 811-813, respectively, in the second read state, and by the Vth distributions 811a-813a, respectively, in the first read state. The verify voltages are VvA-VvC, and the read voltages are VrA-VrC. The Vth downshift due to being in the first read state is greater for the A state than for the B and C states in this example. For the higher data states, the coupling up voltage between the channel and the word line is typically not strong enough to trap more electrons in the charge trapping layer of a memory cell. This is due to a screening effect of the electrons which are already present in the charge trapping layer of the memory cell and provide the high Vth. Instead, the electrons in the charge trapping layer are more attracted towards the control gate/word line, further away from the channel, resulting in a Vth downshift. Data retention effects may also be present for the higher data states, where charge is lost from the charge trapping layer, resulting in a Vth downshift.

FIG. 8C depicts example Vth distributions of MLC memory cells storing three bits per cell. The Er state without and with DRD is represented by the Vth distributions 820 and 820a, respectively. The A-G data states are represented by the Vth distributions 821-827, respectively, in the second read state, and by the Vth distributions 821a-827a, respectively, in the first read state.

The verify voltages of the A-G states are VvA-VvG, respectively. A set of read voltages for the A-G states includes VrA-VrG, respectively. The read voltages can be optimized for the second read state, in one approach. In this example, the Vth distributions 821-824 for the A-D states, respectively, have a Vth upshift in the second read state. The Vth distributions 826 and 827 for the F and G states, respectively, have a small Vth downshift, in the second read state.

Generally, it is helpful for the memory cells with the programmed data states, but harmful to the erased state memory cells, to use a high amplitude for the periodic refresh voltage operations. The amplitude should therefore be carefully set based on various factors as described herein.

In FIG. 9A-9D, the vertical axis represents an average upper tail Vth and the horizontal axis represents a number of read operations, ranging from 1-300. The low and high ambient temperatures, T_low and T_high, respectively, are −25 C and 85 C, respectively, and the low and high numbers of P-E cycles are 37.5K and 100K, respectively. The data is for an SLC block. Read refresh operations are not performed.

FIG. 9A depicts plots of an average upper tail Vth of erased state memory cells as a function of a number of read operations and a delay between the read operations, showing the effects of delayed read disturb for a low ambient temperature and a low number of P-E cycles. The plots 900, 901 and 902 represent a delay between read operations of 2, 5 and 10 minutes, respectively. The Vth increases faster as a function of the number of read operations when the time between read operations is longer.

FIG. 9B depicts plots of an average upper tail Vth of erased state memory cells as a function of a number of read operations and a delay between the read operations, showing the effects of DRD, for a low ambient temperature and a high number of P-E cycles. The plots 910, 911 and 912 represent a delay between read operations of 2, 5 and 10 minutes, respectively. As in FIG. 9A, the Vth increases faster when the time between read operations is longer. Additionally, the highest value of Vth, e.g., the amount of the upshift, is greater when the number of P-E cycles is greater. DRD therefore increases as the number of P-E cycles increases.

FIG. 9C depicts plots of an average upper tail Vth of erased state memory cells as a function of a number of read operations and a delay between the read operations, showing the effects of DRD, for a high ambient temperature and a low number of P-E cycles. The plots 920, 921 and 922 represent a delay between read operations of 2, 5 and 10 minutes, respectively. Compared to FIG. 9A, when the number of P-E cycles is low, the highest value of Vth is greater when the temperature is greater.

FIG. 9D depicts plots of an average upper tail Vth of erased state memory cells as a function of a number of read operations and a delay between the read operations, showing the effects of DRD, for a high ambient temperature and a high number of P-E cycles. The plots 930, 931 and 932 represent a delay between read operations of 2, 5 and 10 minutes, respectively. Compared to FIG. 9B, when the number of P-E cycles is high, the highest value of Vth is greater when the temperature is greater. FIG. 9A-9D also indicate that DRD increases faster with P-E cycles when the temperature is higher.

FIG. 10 depicts plots of a maximum upper tail Vth of erased state memory cells as a function of a number of read operations, for the cases of refresh operations with a high amplitude of Vread (plot 1000), refresh operations with an intermediate amplitude of Vint (plot 1001) and refresh operations with a low amplitude of Vss=0 V (plot 1002). The example is for a block of SLC memory cells with 100K P-E cycles, a high temperature of 85 C and a time between read operations of one minute. With plots 1000, 1001 and 1002, each read operation is followed by a refresh operation.

The plots indicate that the refresh operations can be optimized by adjusting the amplitude of a refresh voltage pulse and refresh operations with smaller amplitude of refresh voltage can help reduce read errors for erased state memory cells. For example, the plot 1001 shows that an intermediate amplitude results in a small reduction in Vth compared to the case where refresh is performed with high amplitude of Vread (plot 1000). The intermediate amplitude can be between Vread=8-9 V and Vss=0 V, in a range such as 3-5 V, for example. The plot 1002 shows that an amplitude of Vss results in a large reduction in Vth for an SLC block.

Generally, refresh operations with different amplitudes lower than Vread improve DRD by different degrees. Since DRD is a direct function of the word line voltages, if all the other variables are kept constant, plot 1000 is the case with the highest word line voltage, which is optimal for keeping the programmed memory cells in the second read state. Plot 1002 is the case which is best for reducing DRD since it uses the lowest word line voltage. However, this is undesirable for the programmed memory cells since it tends to move them into the first read state. Plot 1001 represents a tradeoff which improves DRD somewhat while keeping the word line voltages high enough to maintain the programmed memory cells substantially in the second read state.

FIG. 9A-9D also indicate that the refresh operations can be optimized based on the number of P-E cycles and temperature. In one approach, a refresh operation is performed concurrently on a set of blocks which are in a group having a similar number of P-E cycles. The group can be maintained as the number of P-E cycles increases if an active wear leveling process is used. The number of P-E cycles can be tracked by enterprise solid state devices (SSD) and client SSD systems. One solution is to classify blocks into different categories such as beginning, middle and end of life, based on the readings of P-E cycle counters. Once the number of P-E cycles for a block reaches a threshold, the blocks can be regrouped. Additionally, the size of a group of blocks which are refresh concurrently can be varied for different categories, since the block count in each category can be different. For example, there may be fewer end of life blocks compared to beginning of life blocks.

Further, blocks which have a same number of bits per cell can be grouped in a refresh operation. For instance, SLC blocks can be in one group and MLC blocks can be in another group. Although, it is possible to have concurrent refresh operations for SLC and MLC blocks together. The refresh voltage can be optimized based on the number of bits per cell in a block.

A further optimization can be made based on temperature.

Generally, the refresh operations can provide an optimal tradeoff between minimizing read errors due to DRD and due to memory cells entering the first read state. As a system level solution, the refresh operations can be applied selectively for blocks that are at higher risk of DRD errors or first read state errors without impacting other blocks. The refresh operations are applicable for both SLC and MLC. The refresh operations can increase the read disturb capability of a memory device without increasing errors due to a transition from the first read state to the second read state, which is especially important for end of life blocks. The refresh operations can help reduce failure rates, increasing yield and reducing ECC frequency, thereby reducing costs.

FIG. 11A depicts a flowchart of an example process for refreshing word line voltages. Step 1100 involves programming a plurality of block, e.g., BLK0-BLK4 in FIG. 4. Step 1101 includes storing data indicating a number of bits per cell for each block. For example, see the storage location for bits per cell 119 in FIG. 1A and the table of FIG. 11B. Step 1102 includes reading a block, e.g., in response to receipt of a read command from a host device. Step 1103 includes waiting for a next read command, after which step 1102 is repeated. Read commands can be issued at varying times.

Step 1104 includes beginning a refresh operation for the blocks. This can involve step 1105, which includes accessing a storage location to identify the number of bits per cell for each block. This can involve determining if each block has SLC or MLC cells, for example. It is also possible to have MLC blocks with a different number of bits per cell, where n is the number of bits per cell. It is possible to optimize the refresh voltage based on different values of n. This step can involve accessing the storage location for bits per cell 119 in FIG. 1A and the table of FIG. 11B. Step 1106 includes applying a voltage signal to the word lines of each block, where an amplitude of the voltage signal is based on the number of bits per cell. Step 1106 indicates that there is an option to also set the amplitude based on the number of P-E cycles and/or the temperature. Step 1107 indicates that a wait is implemented before beginning the next refresh operation. The wait can also be optimized for a block based on factors such as the number of bits per cell.

Generally, the refresh operations can be carried out a fixed intervals. Although, if a read command is received at the same time a refresh operation is scheduled, the read command can take priority and the refresh operation can be performed after the completion of the read operation. See FIG. 14A-14C for examples.

FIG. 11B depicts an example table of the storage location for bits per cell 119 of FIG. 1A. In a memory device, both SLC and MLC blocks can be provided. One approach to distinguishing the blocks is to provide a table which cross-references a block identifier to an indication of a number of bits per cell. In this example, the block BLK0 of FIG. 4 is identified as an SLC block, and the blocks BLK1-BLK3 are identified as MLC blocks.

FIG. 11C depicts an example table of the refresh voltage amplitude setting circuit 127 of FIG. 1A. As mentioned, the amplitude of the refresh voltage signal in the refresh operation can be optimized based on factors such as the number of bits per cell and the number of P-E cycles. In this example, the number of P-E cycles is classified as being low if below a threshold or high if at or above the threshold. For example, for an SLC block, if the number of P-E cycles is below a first threshold, P-E_th1, the amplitude of the refresh voltage signal can be a first intermediate voltage, Vint1. If the number of P-E cycles is at or above P-E_th1, the amplitude of the refresh voltage signal can be 0 V or a negative voltage. This approach is based on an increased susceptibility to DRD errors at higher P-E cycles for SLC blocks, with a relatively small concern for maintaining the second read state. Lowering the refresh voltage signal aggressively to a low level such as Vss helps reduce DRD errors as P-E cycles increase.

For an MLC block, if the number of P-E cycles is below a second threshold, P-E_th2, the amplitude of the refresh voltage signal is Vhigh, such as Vread. If the number of P-E cycles is at or above P-E_th2, the amplitude of the refresh voltage signal is a second intermediate voltage, Vint2. In one approach, P-E_th2<P-E_th1. For example, P-E_th2 can be 5K in an MLC block which has a lifetime of 10K P-E cycles, and P-E_th1 can be 50K in an SLC block which has a lifetime of 100K P-E cycles. Additionally, Vint2 can be greater than Vint1 since maintaining the programmed memory cells in the second read state tends to be more important for MLC blocks than for SLC blocks.

This approach is also based on an increased susceptibility to DRD errors at higher P-E cycles for erased cells in MLC blocks, while balancing the need to also maintain the second read state for the programmed cells. Lowering the refresh voltage signal modestly to an intermediate level helps reduce DRD errors while maintaining the second read state for the programmed cells as P-E cycles increase. Lowering the refresh voltage signal to 0 V would likely be an over-compensation for reducing DRD errors at the expense of increasing first read state errors.

Figure 12A:
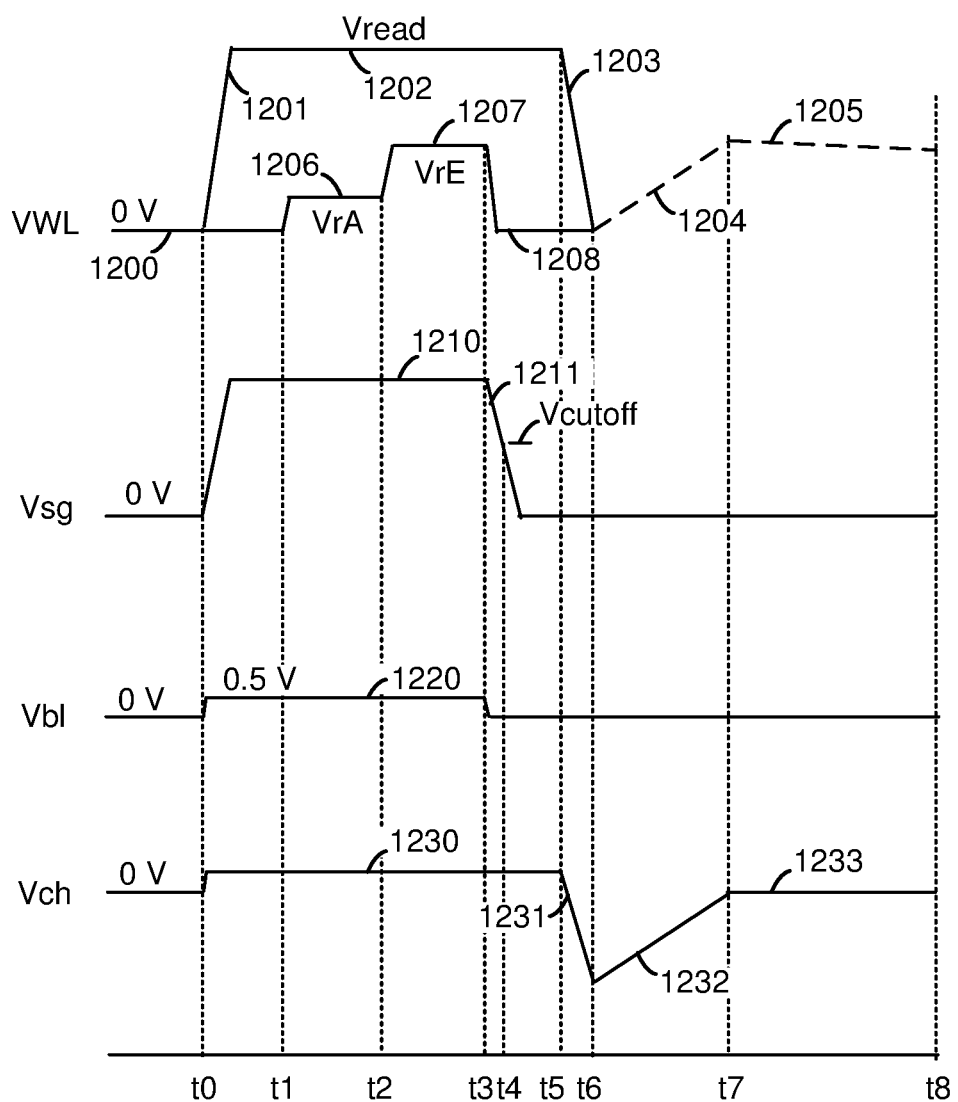
FIG. 12A depicts a first example of voltage signals in a read operation.

FIG. 12A depicts a first example of voltage signals in a read operation. In this example, the word line voltages are reset to 0 V (plot 1200) at the start of the read operation. VWL denotes the word line voltages. For the selected word line (the word line being read), the plots 1206 and 1207 denote read voltages of VrA and VrE, respectively. These voltages are used in a lower page read operation for memory cells storing three bits per cell. During each read voltage, a sensing operation occurs. Plot 1208 denotes the selected word line voltage returning to 0 V.

Plots 1201-1203 represent the voltage signal for unselected word lines. The voltage increases to Vread at t0 (plot 1201), is maintained at Vread until t5, then is decreased to 0 V at t5-t6 (plot 1203). This decrease in the word line voltages down couples the channel so that the channel voltage (Vch) decreases (plot 1231). From t6-t7, the channel voltage recovers back toward 0 V (plot 1232), causing a corresponding coupling up of the word line voltage (plot 1204). Subsequently, the word line voltage gradually decreases (plot 1205). For VWL, the solid line denotes a driven voltage and the dashed line denotes a floating voltage.

Plots 1210 and 1211 represent the voltage signal for the SGD and SGS select gate transistors. The voltage is increased to a peak level at t0 to provide the select gate transistors in a conductive state, maintained at the peak level until t3, then decreased to 0 V at t3-t4. When the Vsg decreases below a cutoff voltage, Vcutoff, at t4, the select gate transistors become non-conductive so that the channel voltage floats. The cutoff of the select gate transistors before the decrease of the unselected word line voltage at t5-t6 allows the channel voltage to be down coupled, as discussed. In another option, the select gate transistors are not cutoff before the decrease of the unselected word line voltage. In this case, the channel voltage begins to float when the unselected word line voltages fall below the Vth of the memory cells, cutting off the respective channel regions.

Plot 1220 represents the voltage signal for the bit lines. Vbl can be set at a small positive level such as 0.5 V during the read operation.

Plots 1230-1233 represent the channel voltage. Vch can be set at a similar level as Vbl, in one approach at t0-t5. As mentioned, Vch can decrease at t5-t6 due to voltage transitions on the unselected word lines and then recover at t6-t7.

Figure 12B:
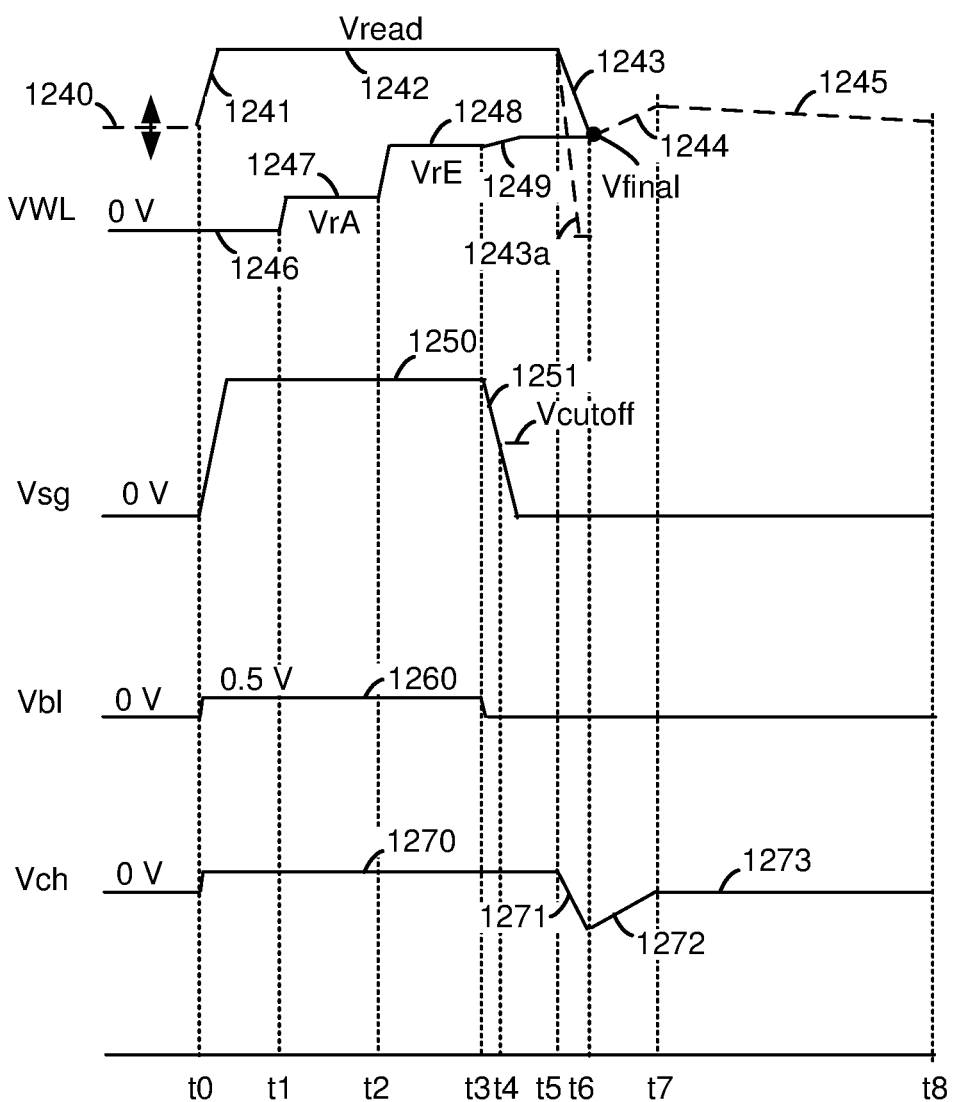
FIG. 12B depicts a second example of voltage signals in a read operation.

FIG. 12B depicts a second example of voltage signals in a read operation. In this example, the unselected word line voltages transition from a floating level (plot 1240) to Vread (plot 1242). For the selected word line, the voltage signal is initially at 0 V (plot 1246) and then at read voltages of VrA and VrE (plots 1247 and 1248, respectively). Plot 1249 denotes the selected word line voltage transitioning to a final voltage, Vfinal, at t6.

Plots 1241-1243 represent the voltage signal for unselected word lines. The voltage increases to Vread at t0 (plot 1241), is maintained at Vread until t5, then is decreased to Vfinal at t5-t6 (plot 1243). This decrease in the word line voltages down couples the channel so that the channel voltage (Vch) decreases at t5-t6 (plot 1271). However, the down coupling is less than in FIG. 12A. From t6-t7, the channel voltage recovers back toward 0 V (plot 1272), causing a corresponding coupling up of the word line voltage (plot 1244). Subsequently, the word line voltage gradually decreases (plot 1245).

As mentioned in connection with FIG. 3, there can be a delay in changing the word line voltage based on a change in a voltage on the pre-switch local control lines due to the capacitance of the word lines. For example, the plot 1243a can represent a change in the pre-switch local control lines 325a and the plot 1243 can represent a corresponding change in the word line voltage. The voltage of the pre-switch local control lines 325a is cutoff at t6 before the word line voltage has a chance to reach 0 V or other minimum level of the pre-switch local control lines. Instead, the word line voltage reaches a final level of Vfinal>0 V.

Plots 1250 and 1251 represent the voltage signal for the SGD and SGS select gate transistors, similar to the corresponding voltage signal in FIG. 12A.

Plot 1260 represents the voltage signal for the bit lines, similar to the corresponding voltage signal in FIG. 12A.

Plot 1270-1273 represent the channel voltage, similar to the corresponding voltage in FIG. 12A, but with a smaller down coupling.

Figure 13:
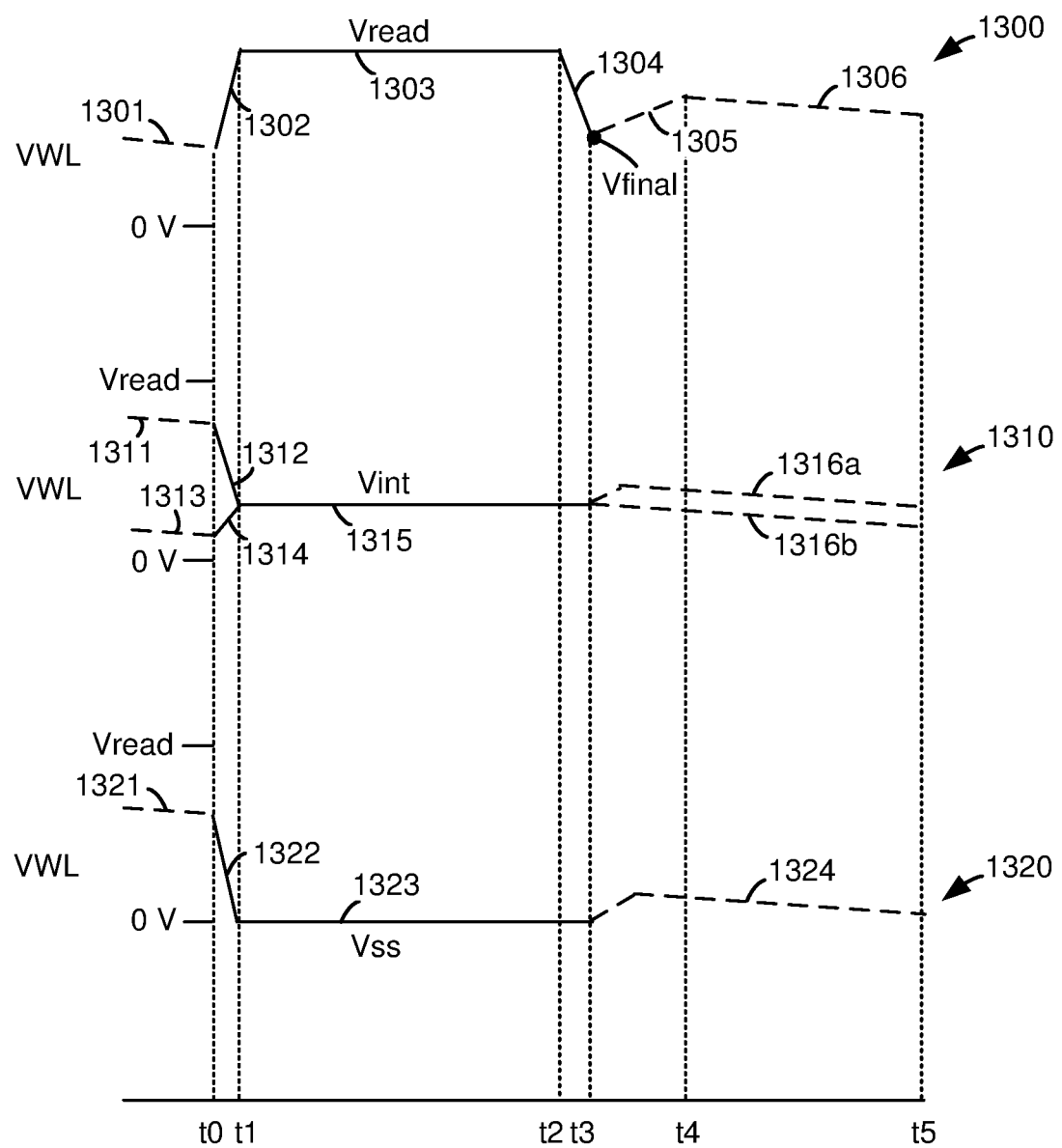
FIG. 13 depicts examples of word line voltages during refresh operations for high, intermediate and low amplitude pulses.

FIG. 13 depicts examples of word line voltages during refresh operations for high, intermediate and low amplitude pulses (plots 1300, 1310, and 1320, respectively). The dashed lines denote floating voltages and the solid lines denote driven voltages. In the plots 1300, a plot 1301 represents an initial floating voltage of the word lines of a block. The refresh operation begins at t0, when the word line voltage is driven higher (plot 1302) to a high amplitude refresh voltage such as Vread, then maintained at Vread (plot 1303) until t2, then driven lower to a final level of, e.g., Vfinal from t2-t3 (plot 1304). As discussed in connection with FIG. 12B, the word line voltage may or may not reach the minimum level provided on the pre-switch control lines. The word line voltage is then allowed to float starting at t3, where it floats higher (plot 1305) and then begins to discharge (plot 1306).

A refresh operation with the high amplitude refresh voltage tends to increase the word line voltage, as depicted by comparing plots 1305 and 1306 to plot 1301. In particular, with a high amplitude refresh voltage, the voltage signal is typically driven lower before being floated. This results in some down coupling of the channel and subsequent up coupling of the channel and word line voltages. The up coupling is added to the word line voltage at the time the floating begins to provide the increasing voltage of plot 1305.

In the plots 1310, two examples are provided for the initial floating voltage of the word lines of a block. A plot 1313 represents a low initial floating voltage and a plot 1311 represents a high initial floating voltage. The refresh operation begins at t0, when the word line voltage is driven higher (plot 1314) or lower (plot 1312) to Vint, then maintained at Vint (plot 1315) until t3. The word line voltage is then allowed to float starting at t3, where it may float slightly higher and then discharge (plot 1316a) if the initial floating voltage is higher than Vint (plot 1311), or it may start discharging from Vint level (plot 1316b) if the initial floating voltage is lower than Vint (plot 1313). Vint can represent Vint1 or Vint2 from FIG. 11C, for example.

A refresh operation with the intermediate amplitude refresh voltage tends to increase the word line voltage if the word line voltage is relatively low, as depicted by comparing plot 1316b to plot 1313, or decrease the word line voltage if the word line voltage is relatively high, as depicted by comparing plot 1316a to plot 1311.

With an intermediate amplitude refresh voltage, the voltage signal may be driven lower before being floated, as with plot 1312, so there is some down coupling of the channel and subsequent up coupling of the channel and word line voltages. The up coupling is added to the word line voltage at the time the floating begins to provide the slightly increasing voltage after t3 for plot 1316a. If the voltage signal is not driven lower before being floated, as with plot 1314, there is no down coupling of the channel and subsequent up coupling of the channel and word line voltages.

In the plots 1320, a plot 1321 represents an initial floating voltage of the word lines. The refresh operation begins at t0, when the word line voltage is driven lower (plot 1322) to a low amplitude refresh voltage such as Vss, then maintained at Vss (plot 1323) until t3. The word line voltage is then allowed to float starting at t3, where it may float slightly higher and then discharge (plot 1324). A refresh operation with a low amplitude refresh voltage tends to decrease the word line voltage, as depicted by comparing plot 1324 to plot 1321.

With a low amplitude refresh voltage, the voltage signal is typically driven lower before being floated, as with plot 1322, so there is some down coupling of the channel and subsequent up coupling of the channel and word line voltages. The up coupling is added to the word line voltage at the time the floating begins to provide the increasing voltage after t3.

FIG. 14A-14C depicts example time periods TP1-TP3 between successive refresh operations. A voltage signal for a refresh operation is denoted by Rf and a voltage signal for a read operation is denoted by Rd.

Generally, the refresh operations can be performed at fixed intervals, as long as a read operation is not in progress. If a read operation is in progress, a wait can be implemented before performing the refresh operation, where the wait is less than the usual period between refresh operations. In this example, first-fourth refresh operations are performed at t1-t2, t3-t4, t7-t8 and t11-t12. The time period between the first and second read operations, TP1, is equal to the time period TP2 between the second and third read operations. However, the time period between the third and fourth read operations, TP3, is greater than TP1 and TP2 due to a wait caused by the read operation at t9-t10.

Read operations are performed at t5-t6 and t9-t10.

The solid line plots denote driven voltages and the dashed line plots denote floating voltages.

FIG. 14A depicts an example of word line voltages during read operations and refresh operations with a high amplitude pulse, Vread. The high amplitude pulses of the refresh operations are represented by the plots 1400, 1401, 1403 and 1405. Since a high amplitude pulse is used, each refresh operation increases the word line voltage. The Vread pulses of the read operations are represented by the plots 1402 and 1404.

FIG. 14B depicts an example of word line voltages during read operations and refresh operations with an intermediate amplitude pulse, Vint. The intermediate amplitude pulses of the refresh operations are represented by the plots 1410, 1411, 1413 and 1415. Since an intermediate amplitude pulse is used, each refresh operation can increase or decrease the word line voltage. For example, the refresh pulses of plots 1410, 1413 and 1415 decrease the word line voltage and the refresh pulse 1411 increases the word line voltage. The Vread pulses of the read operations are represented by the plots 1412 and 1414.

FIG. 14C depicts an example of word line voltages during read operations and refresh operations with a low amplitude pulse, Vss. The low amplitude pulses of the refresh operations are represented by the plots 1420, 1421, 1423 and 1425. Since a low amplitude pulse is used, each refresh operation decreases the word line voltage. The Vread pulses of the read operations are represented by the plots 1422 and 1424.

FIG. 15 depicts an example of an SLC block and an MLC block in a refresh operation. The SLC block, e.g., BLK0, includes a set of memory cells 1500-1503, and a set of word lines 1505 is connected to the set of memory cells. The MLC block, e.g., BLK1, includes a set of memory cells 1510-1513, and a set of word lines 1515 is connected to the set of memory cells. A control circuit is configured to determine that BLK0 stores one bit per cell and that BLK1 stores multiple bits per cell, and to periodically perform a refresh operation for the sets of word lines 1505 and 1515. The performing the refresh operation comprises applying to the set of word lines, a voltage signal having an amplitude based on the number of bits stored per memory cell in the block. For example, the amplitude of the voltage signal applied to the set of word lines 1505 can be different than the amplitude of the voltage signal applied to the set of word lines 1515.

Accordingly, it can be seen that, in one implementation, an apparatus comprises: a set of memory cells arranged in NAND strings in a block; a set of word lines connected to the set of memory cells; and a control circuit connected to the set of word lines. The control circuit is configured to: determine a number of bits stored per memory cell in the block; and periodically perform a refresh operation for the set of word lines, the performing the refresh operation comprises applying to the set of word lines, a voltage signal having an amplitude based on the number of bits stored per memory cell in the block.

In another implementation, a method comprises: determining that a first block of memory cells (BLK0) in a set of blocks (BLK0-BLK3) comprises single-level memory cells (1500-1503), the single-level memory cells of the first block are connected to a first set of word lines (1505); determining that a second block (BLK1) of memory cells in the set of blocks comprises multi-level memory cells (1510-1513), the multi-level memory cells of the second block are connected to a second set of word lines (1515); periodically performing a refresh operation for the first set of word lines, including applying a voltage signal having a first amplitude (0 V, Vint1) to the first set of word lines; and periodically performing a refresh operation for the second set of word lines, including applying a voltage signal having a second amplitude (Vint2, Vhigh), higher than the first amplitude, to the second set of word lines.

In another implementation, an apparatus comprises: a set of memory cells arranged in NAND strings in a block; a set of word lines connected to the set of memory cells; and a control circuit connected to the set of word lines. The control circuit is configured to: program the memory cells with a number of bits per cell; store data in a storage location indicating the number; access the data in connection with a refresh operation for the set of word lines; and in the refresh operation, apply a voltage signal to the set of word lines, the voltage signal having an amplitude based on the data.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of memory cells arranged in NAND strings in a block;
   a set of word lines connected to the set of memory cells; and
   a control circuit connected to the set of word lines, the control circuit is configured to:
   determine a number of bits stored per memory cell in the block; and
   periodically perform a refresh operation for the set of word lines, the performing the refresh operation comprises applying to the set of word lines, a voltage signal having an amplitude based on the number of bits stored per memory cell in the block, including applying a voltage of a first amplitude when the memory cells are single-level memory cells and applying a voltage of a second amplitude that is greater than the first amplitude when the memory cells are multi-level memory cells.

2. The apparatus of claim 1, wherein:
the control circuit is configured to determine a number of program-erase cycles for the block; and
when the number of bits stored per memory cell indicates the memory cells are multi-level memory cells, an amplitude of the voltage signal when the number of program-erase cycles is below a first threshold exceeds an amplitude of the voltage signal when the number of program-erase cycles is above the first threshold.

3. The apparatus of claim 2, wherein:
when the number of bits stored per memory cell indicates the memory cells are single-level memory cells, an amplitude of the voltage signal when the number of program-erase cycles is below a second threshold exceeds an amplitude of the voltage signal when the number of program-erase cycles is above the second threshold; and
the second threshold is greater than the first threshold.

4. The apparatus of claim 1, wherein:
the amplitude of the voltage signal is no more than a predetermined voltage when the number of bits stored per memory cell indicates the memory cells are single-level memory; and
the amplitude of the voltage signal is more than the predetermined voltage when the number of bits stored per memory cell indicates the memory cells are multi-level memory cells.

5. The apparatus of claim 1, wherein:
the amplitude of the voltage signal is no more than 0 V when the number of bits stored per memory cell indicates the memory cells are single-level memory cells; and
the amplitude of the voltage signal is more than 0 V when the number of bits stored per memory cell indicates the memory cells are multi-level memory cells.

6. The apparatus of claim 1, wherein:
the amplitude of the voltage signal is less than 0 V when the number of bits stored per memory cell indicates the memory cells are single-level memory cells; and
the amplitude of the voltage signal is more than 0 V when the number of bits stored per memory cell indicates the memory cells are multi-level memory cells.

7. The apparatus of claim 1, wherein:
the block is in a memory device comprising a plurality of blocks;
a number of bits stored per memory cell varies in the plurality of blocks; and
a storage location indicates a number of bits stored per memory cell in each of the blocks.

8. The apparatus of claim 1, wherein:
the control circuit is configured to determine a workload of read operations for the block, and to set the amplitude of the voltage signal to be relatively high when the workload is relatively low.

9. The apparatus of claim 1, wherein:
the control circuit is configured to monitor threshold voltages of erased state memory cells in the set of memory cells and to reduce the amplitude of the voltage signal when the monitoring indicates an increase in the threshold voltages.

10. The apparatus of claim 1, wherein:
the voltage signal has a duration based on the number of bits stored per memory cell in the block; and
the duration is relatively low when the number of bits stored per memory cell is relatively high.

11. The apparatus of claim 1, wherein:
the block is in a memory device comprising a plurality of blocks;
each block of the plurality of blocks comprises a set of memory cells arranged in NAND strings and connected to a set of word lines;
a number of bits stored per memory cell is different in different blocks of the plurality of blocks; and
the control circuit is configured to periodically perform a refresh operation for the set of word lines of each block, the performing the refresh operation for the set of word lines of each block comprises, for each block, applying a voltage signal having an amplitude based on the number of bits stored per memory cell in the block to the set of word lines of the block, wherein the voltage signals applied to the different blocks have different amplitudes.

12. The apparatus of claim 1, wherein:
the control circuit is configured to provide the voltage signal at a final level after the voltage signal is provided at the amplitude for the refresh operation, the final level is a positive voltage; and
the control circuit is configured to float voltages of the set of word lines after the voltage signal reaches the final level.

13. A method, comprising:
determining that a first block of memory cells in a set of blocks comprises single-level memory cells, the single-level memory cells of the first block are connected to a first set of word lines;
determining that a second block of memory cells in the set of blocks comprises multi-level memory cells, the multi-level memory cells of the second block are connected to a second set of word lines;
periodically performing a refresh operation for the first set of word lines, including applying a voltage signal having a first amplitude to the first set of word lines; and
periodically performing a refresh operation for the second set of word lines, including applying a voltage signal having a second amplitude, higher than the first amplitude, to the second set of word lines.

14. The method of claim 13, wherein:
the determining that the first block of memory cells comprises single-level memory cells and the determining that the second block of memory cells comprises multi-level memory cells comprises accessing a storage location indicating a number of bits stored per memory cell in each block of the set of blocks.

15. The method of claim 13, further comprising:
determining a number of program-erase cycles for the second block, wherein the amplitude of the voltage signal is higher when the number of program-erase cycles is below a threshold than when the number of program-erase cycles is above the threshold.

16. An apparatus, comprising:
a set of memory cells arranged in NAND strings in a block;
a set of word lines connected to the set of memory cells; and
a control circuit connected to the set of word lines, the control circuit is configured to:

program the memory cells with a number of bits per memory cell;

store data in a storage location indicating the number;

determine a number of program-erase cycles for the block;

access the data in connection with a refresh operation for the set of word lines; and in the refresh operation, apply a voltage signal to the set of word lines, the voltage signal having an amplitude based on the data such that when the memory cells are programmed with a single bit per memory cell and the number of program-erase cycles is above a threshold the amplitude is no more than 0 V.

17. The apparatus of claim 16, comprising:

the amplitude is greater when the number is above a threshold than when the number is not above the threshold.

18. The apparatus of claim 16, wherein the control circuit is configured to:

when the memory cells are programmed with multiple bits per memory cell, set the amplitude to more than 0 V.

19. The apparatus of claim 17, wherein the control circuit is configured to:

when the memory cells are programmed with a single bit per memory cell, set the amplitude to a positive voltage when the number of program-erase cycles is below the threshold.

20. The apparatus of claim 16, wherein the control circuit is configured to:

when the memory cells are programmed with multiple bits per memory cell, set the amplitude to an intermediate voltage when the number of program-erase cycles is above a threshold and to a high voltage when the number of program-erase cycles is below the threshold, wherein the intermediate voltage is between 0 V and the high voltage.

* * * * *